(12) United States Patent
Nakamura et al.

(10) Patent No.: US 7,165,318 B2
(45) Date of Patent: Jan. 23, 2007

(54) COMPONENTS PLACING APPARATUS

(75) Inventors: Youichi Nakamura, Osaka (JP); Kunio Sakurai, Toyonaka (JP); Kazumasa Okumura, Kyoto-fu (JP); Ken Takano, Takaishi (JP); Minoru Yamamoto, Ashiya (JP); Hirokazu Honkawa, Ibaraki (JP); Kentaro Nishiwaki, Neyagawa (JP); Yoshihiko Misawa, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 105 days.

(21) Appl. No.: 11/073,715

(22) Filed: Mar. 8, 2005

(65) Prior Publication Data

US 2005/0144779 A1 Jul. 7, 2005

Related U.S. Application Data

(62) Division of application No. 10/201,267, filed on Jul. 24, 2002, now Pat. No. 6,976,304.

(30) Foreign Application Priority Data

Jul. 27, 2001 (JP) ............................. 2001-227469
Sep. 28, 2001 (JP) ............................. 2001-301955

(51) Int. Cl.
*H05K 3/32* (2006.01)
(52) U.S. Cl. ............................ 29/740; 29/741; 29/742; 29/759; 29/720; 29/834; 29/DIG. 44; 414/737; 414/751.1

(58) Field of Classification Search ................. 29/729, 29/739–743, 759, 719–720, 834, DIG. 44; 414/737, 752.1–754; 901/47
See application file for complete search history.

(56) References Cited

U.S. PATENT DOCUMENTS

| 5,671,527 | A | 9/1997 | Asai et al. |
| 6,094,808 | A | 8/2000 | Mimura et al. |
| 6,178,626 | B1 | 1/2001 | Hada et al. |
| 6,256,869 | B1 | 7/2001 | Asai et al. |
| 6,807,726 | B1 | 10/2004 | Iisaka et al. |
| 6,976,304 | B1 * | 12/2005 | Nakamura et al. ............ 29/740 |
| 2002/0017020 | A1 | 2/2002 | Hata et al. |
| 2003/0088974 | A1 | 5/2003 | Nakamura et al. |

* cited by examiner

*Primary Examiner*—Minh Trinh
(74) *Attorney, Agent, or Firm*—Wenderoth, Lind & Ponack, L.L.P.

(57) ABSTRACT

A substantial apparatus width along a board carrying direction of an electronic component placing apparatus for placing electronic components on a board having a length L along the board carrying direction is a total dimension 4L+SL. Specifically, 4L denotes a length of the sum of the lengths of a first board retreat position, a first component placement position, a second board retreat position and a second component placement position. Further, SL denotes a length of the sum of the lengths of the spaces for positioning a board stop mechanism provided at each of the first board retreat position, the first component placement position, the second board retreat position and the second component placement position. Finally, the substantial apparatus width is between 450 mm and 1000 mm inclusively.

4 Claims, 21 Drawing Sheets

COMPONENTS PLACING APPARATUS

This application is a divisional of U.S. Ser. No. 10/201,267, filed Jul. 24, 2002, now U.S. Pat. No. 6,976,304.

BACKGROUND OF THE INVENTION

The present invention relates to an electronic component placing apparatus for placing electronic components on a board and a mounted-board producing apparatus.

Conventionally, when electronic components are mounted on a board such as a printed board, processes of printing a cream-like solder paste on the board, placing the electronic components on the printed solder paste, and heating and cooling the board on which the electronic components are placed to solidify the solder so that the electronic components are fixed on the board are performed.

FIG. 12 is a perspective view showing a configuration of an electronic component placing system 9 for placing electronic components on a board in a conventional mounting system for mounting electronic components on a board. In the electronic component placing system 9, a board on which solder pastes are printed is carried in from a printer from a direction shown with an arrow 901, and the board is carried along a carrying path 902 in the electronic component placing system 9. Various electronic components are placed on the board while the board is carried, and the board is carried out in a direction shown with an arrow 903. Then, the board is carried into a reflow apparatus, and the electronic components are fixed on the board.

In the electronic component placing system 9 shown in FIG. 12, three high-speed placing apparatuses 91 and two multifunctional placing apparatuses 92 are successively disposed, and an inspection apparatus 93 for inspecting electronic components-placed states is disposed between the high-speed placing apparatus 91 and the multifunctional placing apparatus 92. The high-speed placing apparatus 91 is an apparatus for placing a large number of micro electronic components at high-speed on a board, and the multifunctional placing apparatus 92 is an apparatus for placing many types of electronic components on a board.

Meanwhile, the electronic component placing system 9 shown in FIG. 12 is designed such that electronic components can also be placed on a large-size board. On the other hand, as a portable terminal including a cellular phone is widely used, miniaturization of a board incorporated in the portable terminal is also being progressed.

Thus, in order to efficiently place electronic components on a board for a portable terminal by using the electronic component placing system 9, circuits for a multiplicity of portable terminals need to be formed on one board that is carried. However, with diversification of portable terminals, production (mounting) of many types of boards in a small number is more strongly required, and hence the configuration of the electronic component placing system 9 shown in FIG. 12 is becoming unsuitable to placement of electronic components on a board for a portable terminal.

Accordingly, an object of the present invention is to provide an electronic component placing apparatus and a mounted-board producing apparatus suitable to production of a small-size board in consideration to the aforementioned issue.

SUMMARY OF THE INVENTION

In order to achieve the above object, the present invention has the following constitution.

According to a first aspect of the present invention, there is provided an electronic component placing apparatus for placing electronic components on a board having a length L along a board carrying direction, the electronic component placing apparatus comprising:

an electronic component feeding unit for feeding the electronic components;

a carrying unit that can carry the board in the carrying direction from a board retreat position to a component placement position, further from the component placement position to an outside of the component placement position;

a plurality of head units for holding the components from the electronic component feeding unit and then placing the held components on a plurality of boards; and a drive unit for moving the plurality of head units between the electronic component feeding unit and the boards, wherein a substantial apparatus width along the board carrying direction is a total dimension 4L+SL wherein 4L is a length with which each of two boards corresponding to the plurality of head units can be positioned at each component placement position and a board retreat position corresponding to each placement position can be secured and wherein SL is a space for positioning a board stop mechanism at each placement position and each board retreat position, which is between 450 mm and 1000 mm inclusive.

According to a second aspect of the present invention, there is provided the electronic component placing apparatus according to the first aspect, wherein the substantial apparatus width is not less than 540 mm and not more than 660 mm.

According to a third aspect of the present invention, there is provided the electronic component placing apparatus according to the second aspect, wherein a number of the head units is 2.

According to a fourth aspect of the present invention, there is provided the electronic component placing apparatus according to the third aspect, wherein a length L of the carried board along the carrying direction is shorter than 250 mm.

According to a fifth aspect of the present invention, there is provided the electronic component placing apparatus according to the first aspect, wherein moving ranges of the plurality of head units are independent of each other.

According to a sixth aspect of the present invention, there is provided the electronic component placing apparatus according to the first aspect, wherein the drive unit has at least a same number of drive mechanisms capable of moving the head units in two directions perpendicular to each other as that of the plurality of head units.

According to a seventh aspect of the present invention, there is provided the electronic component placing apparatus according to the first aspect, further comprising a cover for housing the plurality of head units and the drive unit, wherein the substantial apparatus width is defined by the cover.

According to an eighth aspect of the present invention, there is provided a mounted-board producing apparatus comprising the plurality of electronic component placing apparatuses according to the first aspect, wherein a board width of the carried board in the carrying direction is shorter than 250 mm; and the substantial apparatus width of each of the plurality of electronic component placing apparatuses in the carrying direction is not less than 450 mm and not more than 1000 mm, and a distance between the plurality of electronic component placing apparatuses is equal to the board width or shorter in the vicinity of positions at which the board is sent and received.

According to a ninth aspect of the present invention, there is provided the mounted-board producing apparatus according to the eighth aspect, wherein each of the plurality of electronic component placing apparatus further comprises a component feeding unit for feeding the electronic components to the head unit; and the component feeding unit is positioned only on one side out of two sides of the carrying path of the carrying unit.

According to a 10th aspect of the present invention, there is provided the mounted-board producing apparatus according to the eighth aspect, wherein each of the plurality of electronic component placing apparatuses further comprises a cover for housing the head unit and the drive unit; and a distance between the plurality of electronic component placing apparatuses is defined by the cover.

According to an 11th aspect of the present invention, there is provided the electronic component placing apparatus according to the first aspect, which comprises:

a protection cover for covering a side of the head unit;

a first retreat mechanism for retreating the protection cover from the head unit;

a panel which is disposed between the protection cover and the head unit and has a display; and a second retreat mechanism for retreating the panel from the head unit independently of the protection cover.

According to a 12th aspect of the present invention, there is provided the electronic component placing apparatus according to the 11th aspect, wherein the first retreat mechanism is a mechanism for rotating the protection cover about an upper end of the protection cover, and the second retreat mechanism is a mechanism for rotating the panel about an upper end of the panel independently of the protection cover.

According to a 13th aspect of the present invention, there is provided a mounted-board producing apparatus comprising placement work units for placing the electronic components on the board with solders therebetween and a reflow work unit for allowing the solders to reflow to fix the electronic components on the board to produce a mounted board, to produce the mounted board from the board while carrying the board to the placement work unit and the reflow work unit, which comprises:

a first unit apparatus having either one of the placement work unit and the reflow work unit and having a dimension which is an integer number of times of a basic dimension along the carrying direction of the board; and a second unit apparatus having the other one of the placement work unit and the reflow work unit and having a dimension which is an integer number which is 2 or more of times of the basic dimension along the carrying direction of the board, wherein the unit apparatus having the placement work unit is the electronic component placing apparatuses according to claim 1, and the first unit apparatus and the second unit apparatus are disposed serially in the carrying direction and fixed movably.

According to a 14th aspect of the present invention, there is provided the mounted-board producing apparatus according to the 13th aspect, wherein each unit apparatus of the first unit apparatus and the second unit apparatus comprises:

a fixing mechanism for fixing the unit apparatus along the carrying direction; and a moving mechanism for releasing fixation of the unit apparatus by the fixing mechanism and moving the unit apparatus off the carrying direction.

According to a 15th aspect of the present invention, there is provided the mounted-board producing apparatus according to the 14th aspect, wherein the fixing mechanism comprises:

a plurality of pillar elevation mechanisms fixed under a machine base of the unit apparatus; and pillars attached to each of the pillar elevation mechanism so as to be raised from or lowered to an installation surface of the unit apparatus from the machine base, the moving mechanism comprises a plurality of wheels that are fixed under the machine base of the unit apparatus and can movably support the unit apparatus on the installation surface;

the unit apparatus is fixed by lowering each of the pillars by each of the pillar elevation mechanisms to lift each wheel from the installation surface and then supporting the unit apparatus by each of the pillars on the installation surface; and the unit apparatus can be moved by raising each pillar of each of the pillar elevation mechanisms and then supporting the unit apparatus by each of the wheels on the installation surface.

According to a 16th aspect of the present invention, there is provided the mounted-board producing apparatus according to the 15th aspect, wherein the pillar elevation mechanism comprises a cylinder, and the pillar attached to the pillar elevation mechanism is moved vertically by operating the cylinder.

According to a 17th aspect of the present invention, there is provided the mounted-board producing apparatus according to the 15th aspect, wherein the pillar is a screw shaft, the pillar elevation mechanism is a nut engaged with the screw shaft, and the pillar attached to the pillar elevation mechanism is moved vertically by reciprocally rotate the screw shaft relatively to the nut.

According to an 18th aspect of the present invention, there is provided the mounted-board producing apparatus according to the 15th aspect, wherein the fixing mechanism further has a depressed portion that can be engaged to an end portion of the pillar lowered by the pillar elevation mechanism and comprises a pillar receiving portion set on the installation surface.

According to a 19th aspect of the present invention, there is provided the electronic component placing apparatus according to the first aspect for a mounted-board producing apparatus for producing a mounted board by placing the electronic components on the board with solders therebetween, which comprises:

a fixing mechanism for fixing the electronic component placing apparatus; and a moving mechanism for releasing fixation of the electronic component placing apparatus by the fixing mechanism and then moving the electronic component placing apparatus, wherein the fixing mechanism comprises:

a plurality of pillar elevation mechanisms fixed under a machine base of the electronic component placing apparatus; and a pillar attached from the machine base to each of the pillar elevation mechanisms so as to be raised from or lowered to the installation surface of the electronic component placing apparatus, the moving mechanism comprises a plurality of wheels that are fixed under the machine base of the electronic component placing apparatus and can movably support the electronic component placing apparatus on the installation surface, the electronic component placing apparatus is fixed by lowering each pillar by the pillar elevation mechanism to lift each of the wheels from the installation surface and then supporting the electronic component placing apparatus by each of the pillars on the installation surface, and the electronic component placing apparatus can be moved by raising each of the pillars by each of the pillar elevation mechanisms and then supporting the electronic component placing apparatus by the respective wheels on the installation surface.

According to a 20th aspect of the present invention, there is provided an electronic component placing apparatus, wherein the head unit comprises a placing unit for placing the electronic components fed from the electronic component feeding unit on the board and a recognition unit for recognizing this board, the electronic component placing apparatus comprises:

an X-axis direction moving apparatus for moving the head unit in an X direction, which is a direction of carrying the board; and a Y-axis direction moving apparatus for moving this X-axis direction moving apparatus in a Y direction perpendicular to the X direction, wherein the X-axis direction moving apparatus is disposed below the Y-axis direction moving apparatus and above the board.

According to a 21st aspect of the present invention, there is provided the electronic component placing apparatuses according to the 20th aspect, wherein the Y-axis direction moving apparatus is disposed almost immediately above a component placement position at which the electronic components are placed on the board.

According to a 22nd aspect of the present invention, there is provided the electronic component placing apparatuses according to the 20th aspect, wherein the X-axis direction moving apparatus is constituted by a linear motor.

According to a 23rd aspect of the present invention, there is provided the electronic component placing apparatuses according to the 20th aspect, wherein the recognition unit is deviated from the placing unit in the Y direction.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1A:
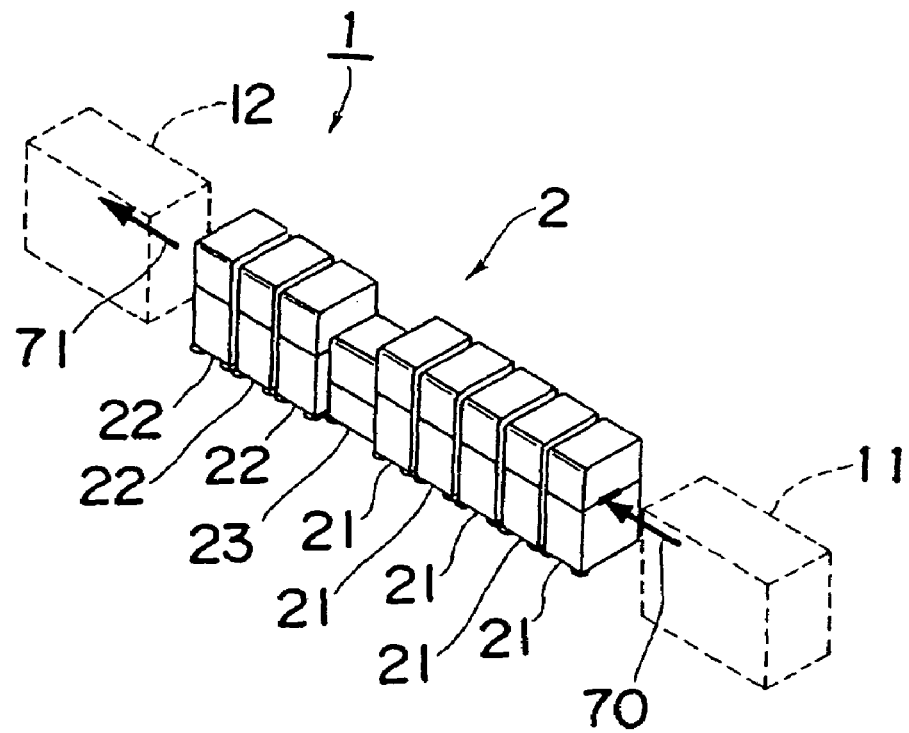
FIG. 1A is a perspective view showing an electronic component placing system in a mounted-board producing apparatus according to a first embodiment of the present invention.

Before the description of the present invention proceeds, it is to be noted that like parts are designated by like reference numerals throughout the accompanying drawings.

Embodiments of the present invention are described in detail with reference to the accompanying drawings.

First Embodiment

Figure 1B:
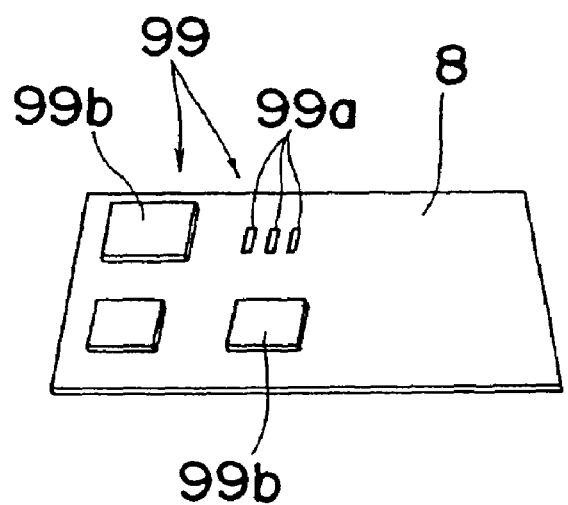
FIG. 1B is a perspective view showing a board on which electronic components are mounted in the electronic component placing system.

FIG. 1A is a perspective view showing an external appearance of an electronic component placing system 2 constituted by a plurality of electronic component placing apparatuses in a mounted-board producing apparatus 1 according to a first embodiment of the present invention. FIG. 1B is a perspective view showing a board 8 on which electronic components 99 are mounted by the plurality of electronic component placing apparatuses in the electronic component placing system 2. The electronic component placing system 2 is disposed between a printer 11 and reflow apparatus 12 of solder pastes in the mounted-board producing apparatus 1 for mounting electronic components 99 on the board 8.

The electronic component placing system 2 has five high-speed placing apparatuses 21 (as one example of the electronic component placing apparatus) and three multifunctional placing apparatuses 22 (as another example of the electronic component placing apparatus), and an inspection apparatus 23 for inspecting a placed state of electronic components is disposed between the high-speed placing apparatuses 21 and the multifunctional placing apparatuses 22. Furthermore, since the high-speed placing apparatuses 21, the inspection apparatus 23, and the multifunctional placing apparatuses 22 are disposed in one line, a path for carrying a board 8 is formed in these apparatuses.

The board 8 on which solder pastes are printed is carried from the printer 11 into the high-speed placing apparatus 21 in a direction shown with an arrow 70, and a multiplicity of micro electronic components 99a are successively placed on the solder pastes on the board 8 by the five high-speed placing apparatuses 21. Then, whether the electronic components are appropriately placed is inspected by the inspection apparatus 23, and various relatively large electronic components 99b are placed on a board 8 that has passed the inspection, by the multifunctional placing apparatus 22.

The board 8 on which placement of various electronic components 99 is completed is carried out of the electronic component placing system 2 in a direction shown with an arrow 71 into the reflow apparatus 12. Then, melting and solidification of the solder pastes is performed, and thus mounting of the electronic components 99 on the board is completed.

Figure 2:
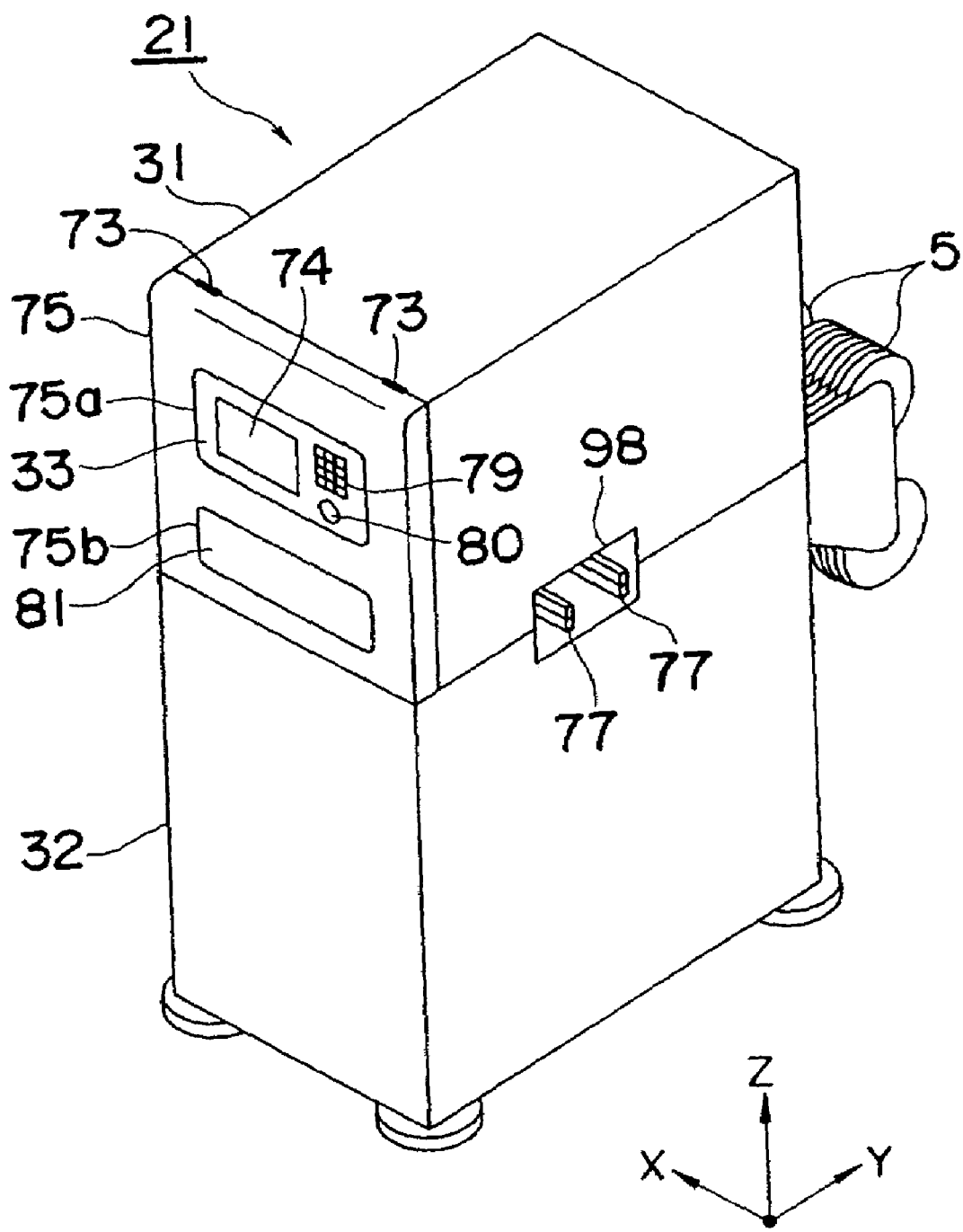
FIG. 2 is a showing a perspective view showing a high-speed placing apparatus in the electronic component placing system.

FIG. 2 is an external perspective view showing the front side, right side, and top of the high-speed placing apparatus 21 for placing electronic components on a board at high speed. The multifunctional placing apparatus 22, which places many types of electronic components on a board, has the same structure as the high-speed placing apparatus 21 except that configurations for feeding or holding components are different. Furthermore, X, Y, and Z directions shown in FIG. 2 represent a direction from the right side to the left side, a direction from the front side to the rear, and a direction from the lower side to the upper side, respectively, facing the front side.

The high-speed placing apparatus 21 has a substantially rectangular parallelepiped shape covered with an upper cover 31 and a lower cover 32, and the front surface of the upper cover 31 constitutes a protection cover 75 that can be opened and closed. Two openings 75a, 75b, upper and lower, are formed in the protection cover 75, and an operation panel 33 is disposed inside the protection cover 75 as opposed to the upper opening 75a. A transparent acrylic plate is attached to the lower opening 75b to form a window 81 for checking the inside of the apparatus.

A pair of parallel carrier rail members 77, which penetrate laterally the inside of the high-speed placing apparatus 21, are laid between the upper cover 31 and the lower cover 32. The left and right openings of the high-speed placing apparatus 21, through which the pair of carrier rail members 77 are slightly projected, constitute ports 98 for carrying in and out a board. Furthermore, as described later, the board 8 is carried on the pair of carrier rail members 77 towards a predetermined carrying direction ((+X) direction) by the drive of a board carrying belt of the pair of carrier rail members 77.

Figure 3:
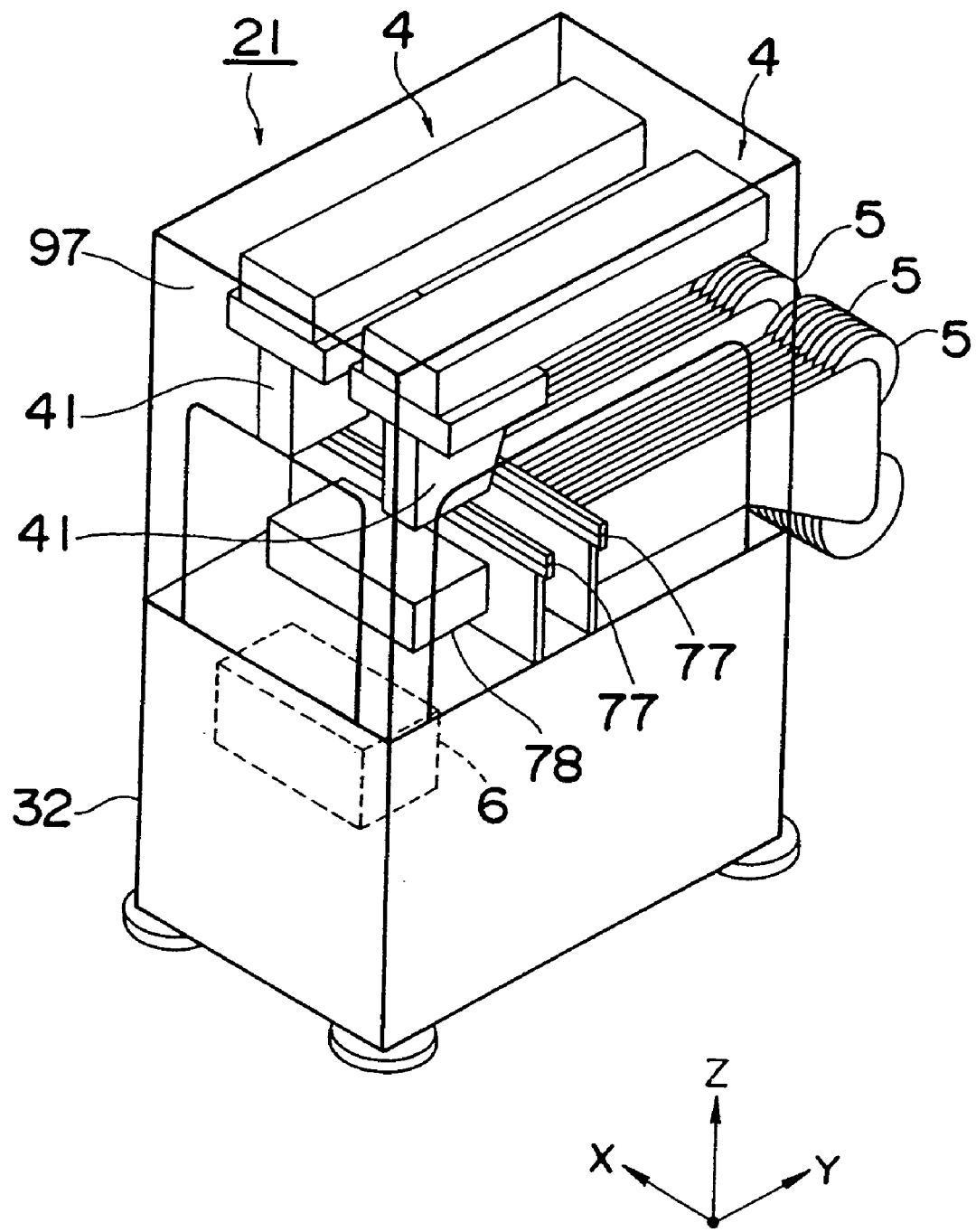
FIG. 3 is a perspective view showing the high-speed placing apparatus in FIG. 2 by seeing through an upper cover.

FIG. 3 is a perspective view showing the internal structure of the high-speed placing apparatus 21 by omitting the upper cover 31, operation panel 33, and so forth. As shown in FIG. 3, two placing mechanisms 4 for placing electronic components are disposed in parallel in the X direction inside the upper cover 31, and a multiplicity of component cassettes 5 are attached from the rear of the high-speed placing apparatus 21. In FIG. 3, a frame 97 for supporting the placing mechanisms 4 is seen-through.

The pair of carrier rail members 77 are connected to a carrying drive unit 78, and the carrying drive unit 78 drives a motor to adjust an interval between the pair of carrier rail members 77 by a width adjusting mechanism connected to a power transmission mechanism of the motor and perform a reciprocal drive of the board carrying belt in the pair of carrier rail members 77 by switching the drive of the power transmission mechanism from the motor. In the pair of carrier rail members 77, pairs of carrying belts for determining a retreat position, carrying belts for determining a placement position, carrying belts for determining a retreat position, carrying belts for determining a placement position, and carrying belt for carrying out of the placement position may be disposed from the right end towards the left end, and the drive of each carrying belt may be independently controlled by the carrying drive unit 78.

Furthermore, a control unit 6 for controlling the placing mechanism 4, component cassettes 5, carrying drive unit 78, and so forth is housed inside the lower cover 32. Therefore, the high-speed placing apparatus 21 can be solely operated even in a state that no other apparatuses exist therearound.

In the high-speed placing apparatus 21, an operation where a head unit 41 of the placing mechanism 4 receives electronic components 99 from the component cassettes 5 and the electronic components 99 are placed onto a board 8 carried on the pair of carrier rail members 77 is repeated. First, the size and the arrangement of component members of the high-speed placing apparatus 21 are explained before detail explanation of each component member. It is noted that the following explanation of the size and the arrangement of component members of the high-speed placing apparatus 21 is similarly applicable to the multifunctional placing apparatus 22.

The high-speed placing apparatus 21 is designed as a machine exclusively used for placing electronic components on a small-size board (for example, a quadrilateral board with one side of shorter than 250 mm). That is, this apparatus is a machine exclusively used for manufacturing a small board for a portable terminal including a cellular phone. Consequently, the production capacity is lower than that of one large-size production line conventionally used, but a manufacture that is advantages in view of yield and switching of the types of boards is realized.

Specifically, by handling a small-size board, a loss caused by disposal of one board can be made smaller than in the case of a large-size board (for example, a quadrilateral board with one side of 250 mm or longer). Furthermore, by reducing the size of the high-speed placing apparatus 21 itself as a machine exclusively used for small-size boards, a heavy work load required to switch the types of boards is relieved. By reducing the size of the high-speed placing apparatus 21 itself, a larger number of production lines can be installed in the same location than in the conventional case. Therefore, productivity per an installation area is not necessarily lowered, but may be improved.

Figure 12:
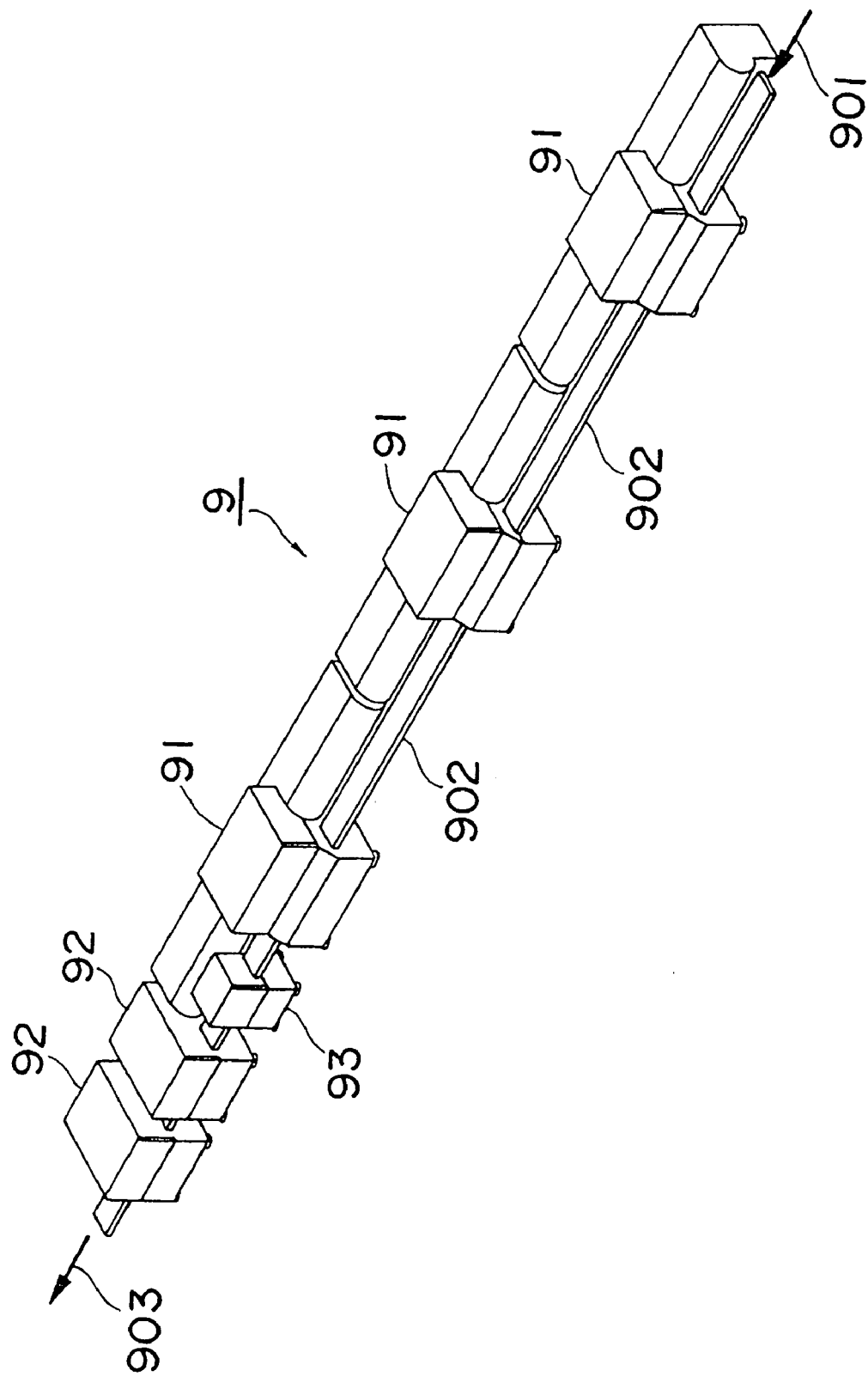
FIG. 12 is a perspective view showing a conventional electronic component placing system.

Furthermore, by installing a multiplicity of lines in a location having the same area, degradation of the production capacity due to a stop of one line can be prevented. Thus, a new added value can be obtained by using the small-size high-speed placing apparatus 21 exclusively used for small-size boards. In comparison with a conventional electronic component placing system 9 shown in FIG. 12, the length of the electronic component placing system 2 shown in FIG. 1A is reduced to ¼ to ⅓ thereof by reducing the sizes of the high-speed placing apparatuses 21 and the multifunctional placing apparatuses 22.

With the above reasons, the high-speed placing apparatus 21 is designed as a placing apparatus made smaller to be exclusively used for small-size boards. Furthermore, the size and the structure of the high-speed placing apparatus 21 are optimized based on viewpoints of human engineering and considerations to productivity.

Figure 4:
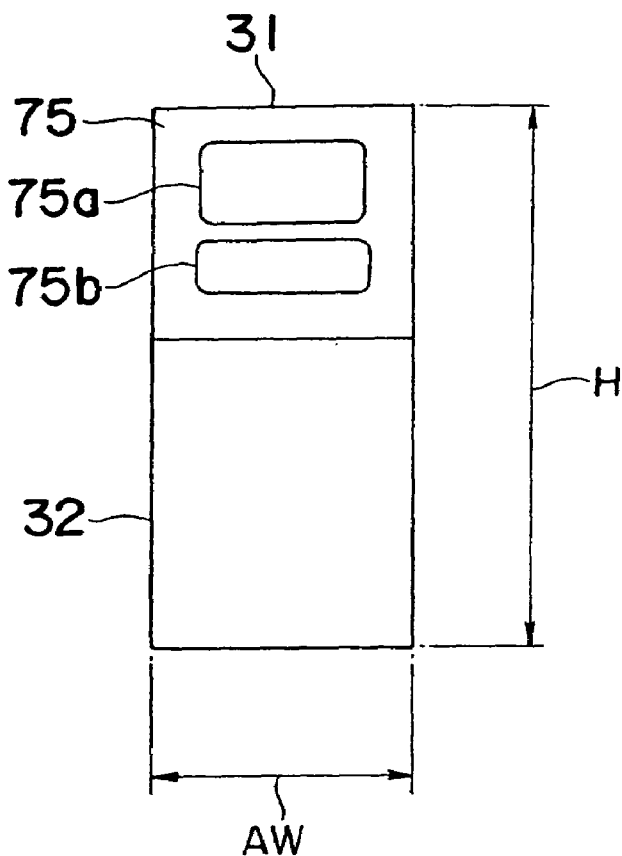
FIG. 4 is a front view showing the high-speed placing apparatus.
Figure 5:
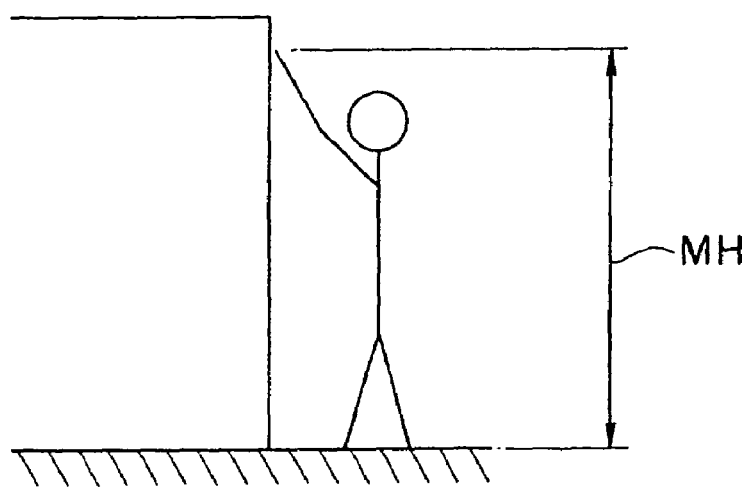
FIG. 5 is a view showing how an operator operates the high-speed placing apparatus.

As shown in FIG. 4, when the apparatus width when viewed from the front (that is, a substantial apparatus width in the carrying direction) is assumed as AW and the apparatus height is H, H is inevitably increased if the apparatus size is reduced (precisely, reduction of the occupation area). However, as shown in FIG. 5, since the height MH, at which an operator can perform works such as maintenance of the apparatus, initial adjustment, drive operation, and so forth, that is, the height in view of operatability is usually about 2000 mm, the apparatus height H is also preferably limited to about 2000 mm. Furthermore, limiting the apparatus height H to about 2000 mm is also preferable since the apparatus can be reached (edges of the apparatus can be touched by extending the hands of an operator) without using a pedestal in view of safety. From these viewpoints, the apparatus height is used to be about 1300-2000 mm.

Meanwhile, in new installment of the high-speed placing apparatus 21 or rearrangement of the line configuration, the high-speed placing apparatus 21 needs to be transported. At this time, if the apparatus width AW is too small, it is difficult to support the high-speed placing apparatus 21 in a stable manner. Here, when it is assumed that a restoring force needs to be generated so that the apparatus attitude returns to the original standing attitude even if the centroid of the apparatus coincides with the center of the apparatus and the inclination of the apparatus is about 20°, the height H and the width AW need to satisfy the following mathematical expression.

$$H \cdot \tan 20° < AW$$

As a result, it can be concluded that, when the height H is about 1300 mm, the width AW needs to be at least 450 mm, and when the height H is about 2000 mm, the width AW needs to be at least 600 mm. Therefore, the apparatus does not fall and the attitude thereof can be restored even if the apparatus is inclined at installation of the apparatus, and damage and a load to the apparatus itself can be relieved.

Figure 6:
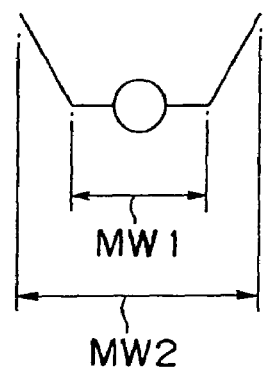
FIG. 6 is a view showing how the operator operates the high-speed placing apparatus.

On the other hand, when the operator performs an operation or a work as opposed to the high-speed placing apparatus 21 as shown in FIG. 6, the operation or work becomes difficult if the apparatus width AW is too small. In particular, much labor is required to perform works inside the apparatus such as attachment of component cassettes 5 in the apparatus, lubrication and initial value adjustment for head units 41 and carrier rail members 77, replacement of nozzles 86, adjustment of a recognition camera, and so forth.

Furthermore, when one of a plurality of arranged high-speed placing apparatuses 21 is removed and an operator works in the gap generated by the removal, the work itself is impossible without a gap of at least 450 mm since the operator needs to bend down particularly for work to be performed on the lower portion of the apparatus. Since the operator width MW1 is generally about 600–650 mm and a gap that allows an operator to enter is preferably at least 600 mm, an apparatus width AW more preferably needs to be about 600 mm.

From the above, the width AW of the high-speed placing apparatus 21 needs to be 450 mm or greater, preferably about 600 mm (when "about" is interpreted as in the range of ±10%, 540–660 mm is obtained) from the viewpoints of human engineering or operatability.

It is needless to say that, as the apparatus width AW is increased, the attitude of the apparatus becomes more stable and the gap generated by removal of an apparatus becomes larger. However, when the apparatus is made larger, as described above, tasks for switching the types of boards or replacement of the apparatus require much labor. Therefore, this is not preferable from the viewpoint of handling of many types of small-size boards. Furthermore, when the apparatus width AW is too large, an operator needs to move to perform an operation or confirmation task on one apparatus. Therefore, the apparatus width AW is preferably limited to a width MW2 of 1000 mm or smaller, with which an operator can work with both arms extended.

As described above, as a placing apparatus exclusively used for small-size boards, the width is preferably not less than 450 mm not more than 1000 mm, more preferably about 600 mm. Accordingly, the width AW of the high-speed placing apparatus 21 is about 600 mm.

The apparatus width AW refers to a substantial width and does not include protrusions existing in the outer periphery of the apparatus or attached members in view of the width. Specifically, when the placing mechanism 4 including the head unit 41 is covered with a cover to protect the apparatus and the operator as shown in FIG. 3, the width defined by the cover can be defined as a substantial apparatus width, and if the apparatus is not covered with a cover, the width defined by the frame of the apparatus can be defined as a substantial apparatus width.

Figure 7:
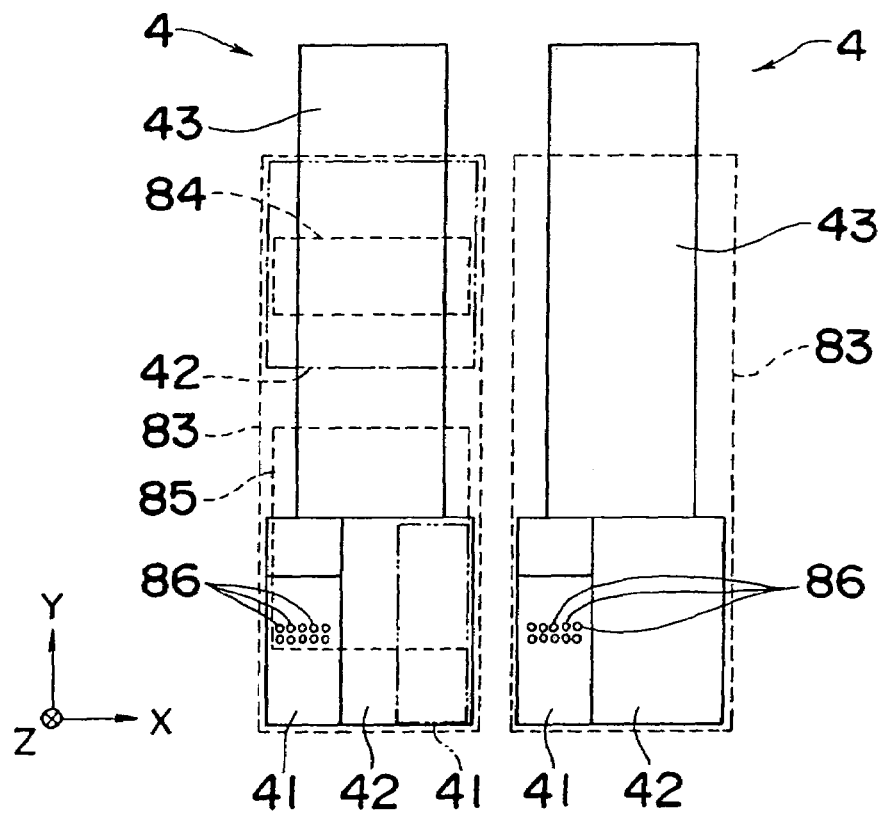
FIG. 7 is a bottom view showing a placing mechanism of the high-speed placing apparatus.

FIG. 7 shows two placing mechanisms 4 viewed from below. A head unit 41 of the placing mechanism 4 has ten nozzles 86 for receiving electronic components from the component cassettes 5 by suction and can be moved in the X direction by a drive mechanism 42 having a linear motor as a drive source as one example of a drive unit. Furthermore, the drive mechanism 42 can also be moved in the Y direction by a drive mechanism 43 having a linear motor as a drive source as one example of a drive unit. Therefore, a moving range required for movement of the mechanism constituted by the drive mechanism 42 and the drive mechanism 43 is a region shown with a reference numeral 83 in FIG. 7.

Each nozzle 86 of the head unit 41 can move vertically and rotate about a shaft extending in the Z direction. Consequently, the electronic components sucked by the nozzles 86 can be placed on a board in various directions.

As shown in FIG. 7, the moving ranges 83 of two placing mechanisms 4 are not overlapped and made independent. Consequently, the two placing mechanisms 4 can be independently controlled, and programming for control becomes easy. Furthermore, since the same number of drive mechanisms 42, 43 as the head units 41 exist, each head unit 41 can be controlled in a completely independent manner and thus controlled even more easily.

In the high-speed placing apparatus 21, the two placing mechanisms 4 are disposed as shown in FIG. 3. As described above, this is the case where the apparatus width AW is made about 600 mm. When the apparatus is designed as an apparatus exclusively used for small-size boards, this is a usual constitution because disposition of two placing mechanisms 4 is an optimal design from the viewpoint of the size of the placing mechanism 4 which are made smaller. In particular, when the moving ranges 83 of the placing mechanisms 4 do not interfere with each other as shown in FIG. 7, disposition of two placing mechanisms 4 is preferable in view of rigidity of the placing mechanisms 4 and size of an available linear motor.

Furthermore, in the high-speed placing apparatus 21, the placing mechanisms 4, component cassettes 5 and so forth are disposed so as to be left-and-right symmetrical (left-and-right symmetrical with respect to a direction perpendicular to the carrying direction). The high-speed placing apparatus 21 has a structure long in the height direction to minimize the occupied floor area. Therefore, it is highly likely that the high-speed placing apparatus 21 is inclined laterally when the apparatus is transported. Accordingly, by adopting an almost left-and-right symmetrical structure in the high-speed placing apparatus 21, the attitude of the high-speed placing apparatus 21 is made stable when transported or installed. The aforementioned equation 1 is based on a prerequisite that the centroid of the high-speed placing apparatus 21 is located almost at the center, such a prerequisite is provided by considering that the high-speed placing apparatus 21 has an almost left-and-right symmetrical structure.

Furthermore, the length of one side of the quadrilateral of the board 8 is determined by, for example, dividing 1000 mm equally. Therefore, as the length of one side of the quadrilateral (for example, square) of the board, 500 mm, 330 mm, 250 mm, 200 mm, and so forth are adopted. If the length of one side of the board square is 100 mm, 10-length× 10-width=total 100 boards are connected and constitute one board 8 for producing multiple boards which has a length of one side of the square of 1000 mm. Here, when a small-size board having a length of one side of the quadrilateral of less than 250 mm is handled, there can be physically two or more boards 8 that can exist in the apparatus by making the apparatus width AW about 600 mm. As a result, disposition of two placing mechanisms 4 is a design more appropriate than disposition of one.

Figure 8:
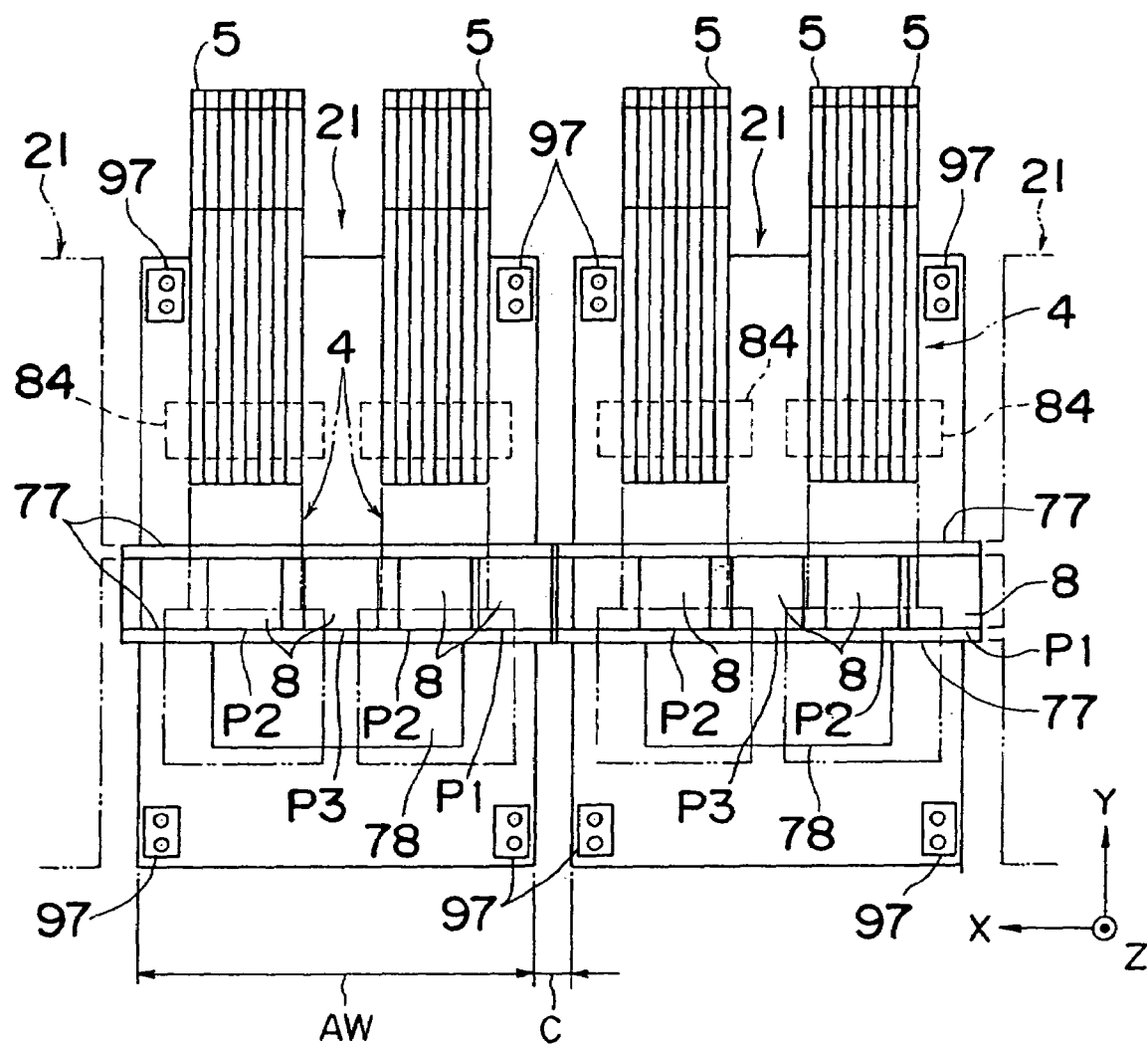
FIG. 8 is a plan view showing a portion below the placing mechanism of the high-speed placing apparatus.

FIG. 8 is a plan view showing the configuration below the head unit 41. Hereafter, operations of the high-speed placing apparatus 21 are explained with reference to FIGS. 7 and 8. FIG. 8 shows an example where electronic components 99 are placed on a board 8 with 100 mm square.

When a board 8 is positioned from the outside of the apparatus to a board retreat position P1, then from the board retreat position P1 to a component placement position P2 generally below the placing mechanism 4 for the first placing mechanism 4 while sandwiched by a pair of carrier rail members 77 (when positioned from the component placement position P2 of the first placing mechanism 4 to a board retreat position P3, then from the board retreat position P3 to a component placement position P2 generally below the placing mechanism 4 of a second placing mechanism 4 for the second placing mechanism 4), the head unit 41 moves to the component cassette 5 side. The component cassette 5 has a reel to which a tape having electronic components 99 placed thereon is wound as shown in FIG. 3, and when the tape is fed out from the reel to an end of the component cassette 5 (end on the side of the pair of carrier rail members 77), the electronic components 99 are fed to the side of the pair of carrier rail members 77.

Usually, when an apparatus is made smaller in size, many types of electronic components 99 are placed by feeding the electronic components 99 from both sides of a carrying path. In this case, a component cassette 5 for spare electronic components 99, that is, for replacement needs to be disposed both in front and rear of the apparatus, and hence this eventually prevents the mounting system from substantially being made smaller. However, in this high-speed placing apparatus 21, as shown in FIG. 8, component cassettes 5 are positioned only on one side of the pair of carrier rail members 77. Consequently, while the apparatus is made smaller, spare electronic components 99 need to be prepared only in the rear of the apparatus, and thus the occupation area can be reliably reduced substantially.

In FIGS. 7 and 8, a region shown with reference numeral 84 represents a region where nozzles 86 of the head unit 41 suck electronic components 99. When electronic components 99 are taken out of the component cassettes 5 in the region 84, the head unit 41 moves to above the board 8. A region shown with reference numeral 85 in FIG. 7 is a region where the head unit 41 places the electronic components 99 on the board 8, and the board 8 is positioned in this region 85. In the example shown in FIG. 8, a 100-mm board 8 is handled in the high-speed placing apparatus 21, and electronic components 99 are simultaneously placed onto two boards 8 positioned at the component placement positions P2 located directly below the two placing mechanisms 4 out of four boards 8 positioned on the retreat position P1, component placement position P2, retreat position P1, and component placement position P2 on the pair of carrier rail member 77.

When the head unit 41 is positioned above the boards 8 by the drive mechanism 42 and the drive mechanism 43, the direction of each nozzle 86 (the direction of rotation about the nozzle central shaft generally on a horizontal plane) is adjusted, and then the nozzles 86 are lowered so that the electronic components 99 are placed on solder pastes on the board 8. This is not shown in FIG. 8, but, when the electronic components 99 are sucked by the nozzles 86, states of the sucked electronic components 99 are checked by using a camera.

By the operations described above, suction of the electronic components 99 from the component cassettes 5 and placement of the electronic components 99 onto the board 8 are repeated by the placing mechanisms 4, and thus required electronic components 99 are placed on two boards 8 at the component placement positions P2 directly below the two placing mechanisms 4. When the placement of the electronic components 99 is completed, the board 8 is carried from the component placement position P2 to a position outside of the component placement position P2, from right to left in FIG. 8 (in the (+X) direction) by drive of the pair of carrier rail member 77 by the carrying drive unit 78, and a new board 8 is positioned from the retreat position P1 or P3 to the component placement position P2 directly below the placing mechanism 4. At this time, one board 8 is carried in from the right side surface of the high-speed placing apparatus 21 onto the pair of carrier rail members 77, and one board 8 at the left end is carried out of the pair of carrier rail members 77 from the left side surface.

Next, arrangement of a plurality of high-speed placing apparatuses 21 is explained below with reference to FIG. 8.

As shown in FIG. 8, a gap between the high-speed placing apparatuses 21 that are adjacent to each other (hereinafter, referred to simply as "distance between the apparatuses") is restricted to a very narrow dimension. For example, in FIG. 8, the apparatus width AW of a high-speed placing apparatus 21 is 600 mm, and a gap C between two adjacent high-speed placing apparatuses 21 is 55 mm. The length of the portions of the pair of carrier rail members 77 protruded from the side surface of the apparatus is 25 mm, and a gap between the pairs of carrier rail members 77 of the adjacent apparatuses is 5 mm. Consequently, the width AW of the high-speed placing apparatus 21 is restricted, and the length of the electronic component placing system 2 when a plurality of high-speed placing apparatuses 21 are arranged can be restricted to be short.

In general, the distance between conventional placing apparatuses is a length with which an operator can remove a board (however, this is not applicable to the case where a particularly large board is handled). That is, the distance between the apparatuses is set to be longer than the length parallel to the carrying direction out of the lengths of the board. The length is thus set for the purpose of removing a board with electronic components defectively placed thereon as required immediately after carried out from the apparatus.

On the other hand, in the high-speed placing apparatus 21 according to the first embodiment, although a small-size board, in particular, a board having a board width in the carrying direction of less than 250 mm is handled, the distance between the apparatuses can be set to be equal to the board width in the carrying direction or shorter. Consequently, the length of the electronic component placing system 2 can be made very short (that is, the length of the mounted-board producing apparatus 1 can be made shorter), and freedom can be achieved to the layout when the whole mounted-board producing apparatus 1 is installed.

Furthermore, since the length of the mounted-board producing apparatus 1 is made shorter, the number of boards 8 placed on the carrier line (particularly, the number of boards 8 existing within the electronic component placing system 2) can be inevitably reduced. As a result, the number of in-process boards 8 can be reduced, and hence the number of boards 8 discarded at the time of switching of the types of boards 8 or trouble of the placing system can be reduced.

An operation panel 33 in the high-speed placing apparatus 21 is explained below. In the high-speed placing apparatus 21, since the apparatus width AW is restricted to be small, the operation panel 33 is attached by a method different from conventional methods. Usually, when the gap between apparatuses is sufficiently wide, the operation panel is disposed between the apparatuses. Furthermore, when the height of the apparatus is low, the operation panel is disposed on top of the apparatus.

As described above, since the gap between the apparatuses is set to be small, and the height of the apparatus can be set to be high so that the apparatus width AW is restricted to small in the high-speed placing apparatus 21. Accordingly, the operation panel 33 is disposed inside the apparatus. At least when the distance between the apparatuses is smaller than the width of the operation panel 33, the operation panel 33 needs to be disposed on top of or inside the apparatus. When the height of the apparatus exceeds 1500 mm, the operation panel 33 inevitably needs to be disposed inside the apparatus in view of operatability. In the high-speed placing apparatus 21, as shown in FIG. 2, the operation panel 33 is disposed between the front protection cover 75 and the head unit 41.

Figure 9:
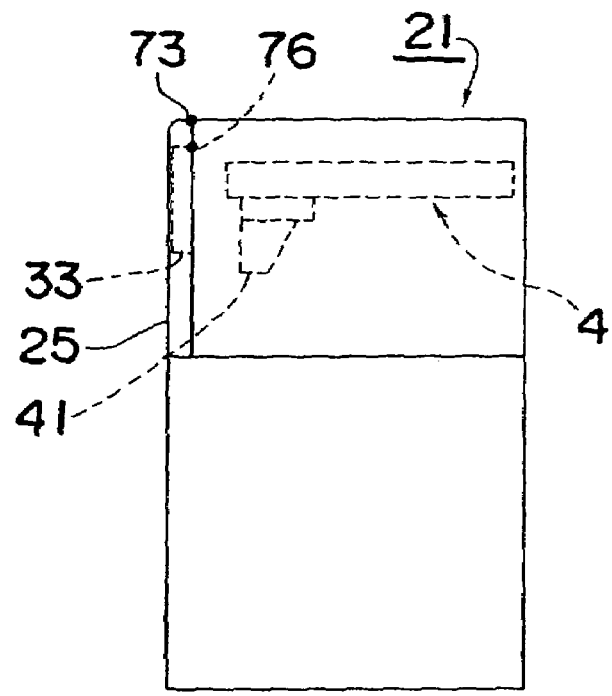
FIG. 9 is a side view showing the high-speed placing apparatus.

As shown in FIG. 2, a display 74 for displaying various information for an operator, operation buttons 79 for receiving various operations from the operator, a stop button 80 for an emergency stop, and so forth are arranged on the operation panel 33. The protection cover 75 is supported rotatably by a pair of hinges 73 at an upper end as one example of a first retreat mechanism. Consequently, the protection cover 75 can be opened or closed about the hinges 73 as the center from the state shown in FIG. 9 to the state shown in FIG. 10.

However, in the state shown in FIG. 10, while the operator can work for the portion below the head unit 41, tasks to be performed on an upper portion of the placing mechanism 4 or the front of the head unit 41 are difficult due to the operation panel 33 as a shield.

Figure 10:
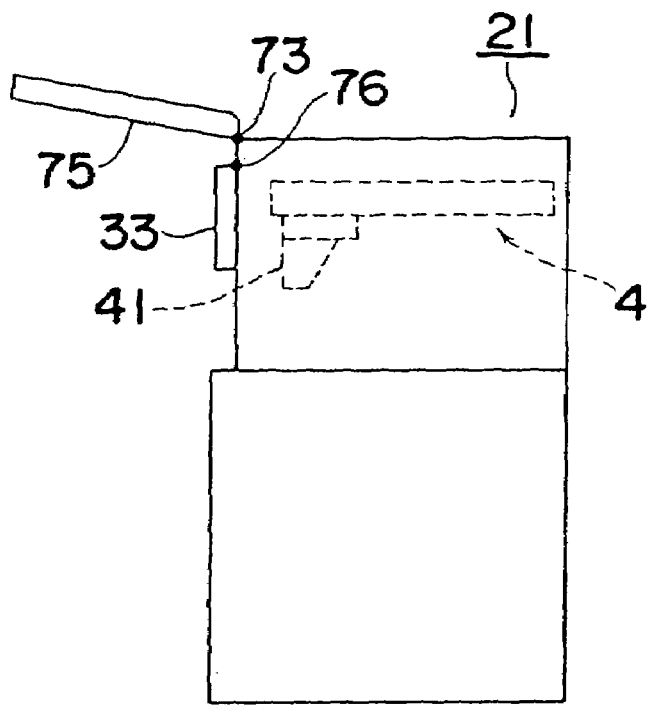
FIG. 10 is a view showing a state that a protection cover of the high-speed placing apparatus is open.
Figure 11:
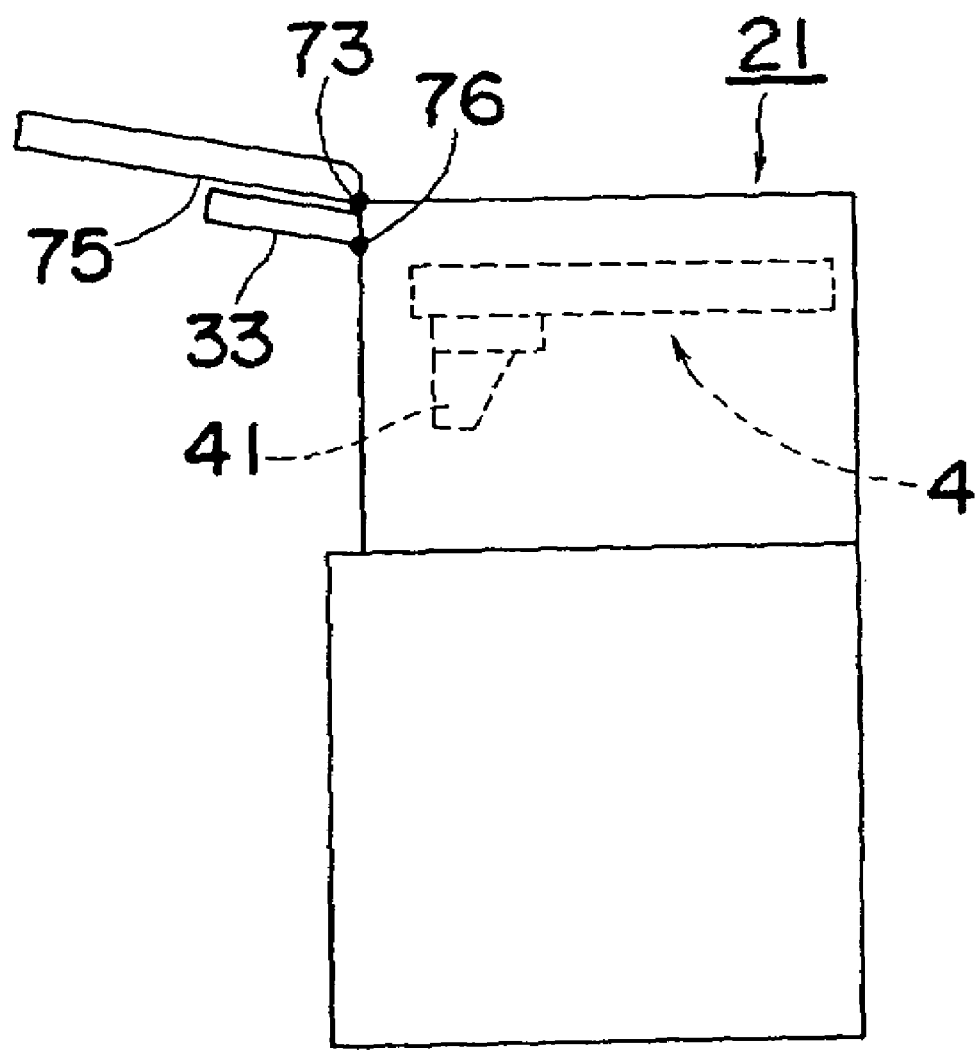
FIG. 11 is a view showing a state that an operation panel of the high-speed placing apparatus is retreated from a head unit.

Accordingly, in the high-speed placing apparatus 21, as one example of a second retreat mechanism, a hinge 76 is provided at the upper end of the operation panel 33 and the operation panel 33 can rotate about the hinge 76 from the state shown in FIG. 10 to the state shown in FIG. 11. Consequently, the operation panel 33 including the display 74 can be retreated from the head unit 41, and tasks for the head unit 41 and tasks for the upper portion of the placing mechanism 4 can be easily performed.

The first embodiment of the present invention has been explained above, but the scope of the present invention is not limited to the above embodiment and can be modified in various manners.

For example, the above explanation has mainly been about the reduction of the size of the high-speed placing apparatus 21, but, as described above, a multifunctional placing apparatus 22 for placing many types of electronic components 99 can be similarly designed by changing the configuration of feeding of electronic components 99 or the shapes of nozzles of the head unit 41. That is, the configuration of feeding of components 99 is not limited to a tape method, but a tray method, where electronic components 99 are arranged on a tray, or other methods may be adopted. Furthermore, electronic components 99 do not necessarily need to be sucked and held by nozzles 86, but electronic components 99 may be held by the head unit 41 by other means such as a mechanical chuck or the like. Thus, the placing apparatus according to the first embodiment can be utilized as a placing apparatus for placing various electronic components 99 on a board 8. The following various modified examples can also be applied to a multifunctional placing apparatus 22.

In the first embodiment, a board 8 is carried linearly along a pair of carrier rail members 77, but the carrying direction does not need to be precisely linear so long as an approximate carrying direction is determined. For example, when electronic components 99 are placed on the board 8, the board 8 may be slightly lifted instead of lowering nozzles 86, or, furthermore, the board 8 may be carried to a position off the pair of carrier rail members 77. Furthermore, the carrying method is not limited to a method using a pair of carrier rail members, but the board 8 may be carried on a belt conveyer, or the board 8 may be carried while being held by a mechanical chuck or a vacuum chuck.

In the first embodiment, an optimum design is achieved by disposing two head units 41 under a precondition that the apparatus width AW is about 600 mm. When the apparatus width AW is about 1000 mm or a new mechanism is developed as a placing mechanism 4, three or more head units 41 can be disposed.

Furthermore, in the first embodiment, the head unit 41 of the placing mechanism 4 moves in two directions perpendicular to each other, but, naturally, the head units 41 may be able to move in a vertical direction.

In the first embodiment, it is explained that the distance between the placing apparatuses is set to be less than the board width in the carrying direction, but, naturally, the distance between the apparatuses does not include unnecessary protrusions in the outer periphery of the apparatuses or additional component members in view of the distance. In the electronic component placing system 2 according to the first embodiment, although a small-size board is handled, the distance between the apparatuses is reduced to such an extent that removal of a board is impossible between the apparatuses, thereby minimizing the electronic component placing system 2 to the limit.

Therefore, the distance between apparatuses refers to a distance in the vicinity of positions at which a board 8 is sent and received between the apparatus. When a placing mechanism 4 including a head unit 41 is covered with covers to protect the apparatuses and the operator, the distance between apparatuses can be defined as a distance between the covers in the vicinity of the positions at which the board 8 is sent and received. Alternatively, the distance between apparatuses can also be defined as a distance over which a board 8 is carried from the time when an end of a carried-out board 8 is seen outside the cover to the time when the end of the board 8 is carried into the cover of the other apparatus.

Naturally, no cover may exist depending on the apparatus. Even in this case, generally, since the apparatuses are surrounded by frames, the distance between apparatuses can be defined as a distance between the frames in the vicinity of the positions at which the board 8 is sent and received.

In the first embodiment, the protection cover 75 covering the side of the head unit 41 and the operation panel 33 can be retreated from the head unit 41 by using rotation mechanisms (that is, hinges 73, 76 as one example) so as to rotate about their respective upper ends. However, the hinges 73, 76 are only adopted to appropriately retreat the protection cover 75 and the operation panel 33 in the simplest configuration, and the protection cover 75 and the operation panel 33 may be able to be retreated independently by other retreat mechanisms. For example, the protection cover 75 and the operation panel 33 may be retreated to above the apparatus by sliding mechanisms, or to a side of or below the apparatus so long as they do not interfere with other configurations or adjacent apparatuses.

Furthermore, the operation panel 33 may include only a display 74, and the operation buttons may be separately provided. Furthermore, the operation panel 33 may be constituted by disposing a touch panel on the display 74. That is, the operation panel 33 may be defined as one example of a panel having at least a display 74.

According to first to seventh aspects of the present invention, an electronic component placing apparatus can be appropriately made smaller.

Furthermore, according to the second aspect of the present invention, an electronic component placing apparatus can be more appropriately made smaller, and, according to the third aspect of the present invention, the electronic component placing apparatus that is made smaller can be appropriately configured.

Furthermore, according to the fourth aspect of the present invention, an electronic component placing apparatus can be appropriately made smaller depending on the size of a handling board.

Furthermore, according to the fifth aspect of the present invention, movement of a head unit can be easily controlled, and, according to the sixth aspect of the present invention, movement of the head unit can be more easily controlled.

Furthermore, according to the seventh aspect of the present invention, an electronic component placing apparatus and an operator can be protected by a cover.

According to eighth to tenth aspects of the present invention, the whole mounted-board producing apparatus, particularly, an electronic component placing system constituted by a plurality of component placing apparatuses can be made smaller.

Furthermore, according to the ninth aspect of the present invention, a substantial occupation area of the whole mounted-board producing apparatus, particularly, an electronic component placing system constituted by a plurality of component placing apparatuses can be reduced.

Furthermore, according to the tenth aspect of the present invention, an electronic component placing apparatus and an operator can be protected by a cover.

According to the 11th and 12th aspects of the present invention, works for the rear of the display can be easily performed.

Furthermore, according to the 12th aspect of the present invention, a display can be retreated by a simple mechanism.

Second and Third Embodiments

Second and third embodiments of the present invention relate to a mounted-board producing apparatus including a placement work unit for placing a plurality of electronic components on a board with solder therebetween, and a reflow work unit for allowing the solder to reflow to fix the electronic components on the board, wherein, while a plurality of the boards are carried into the placement work unit and the reflow work unit, a plurality of mounted boards are produced from the plurality of boards.

Conventionally, various structures of this type of mounted-board producing apparatus are known. For example, a conventional mounted-board producing apparatus 1201, as shown in FIG. 18, is disposed on a carrier line and, by a plurality of types of work apparatuses performing predetermined tasks for boards, electronic components are mounted on a plurality of boards successively carried in these work apparatuses to produce mounted boards.

Figure 18:
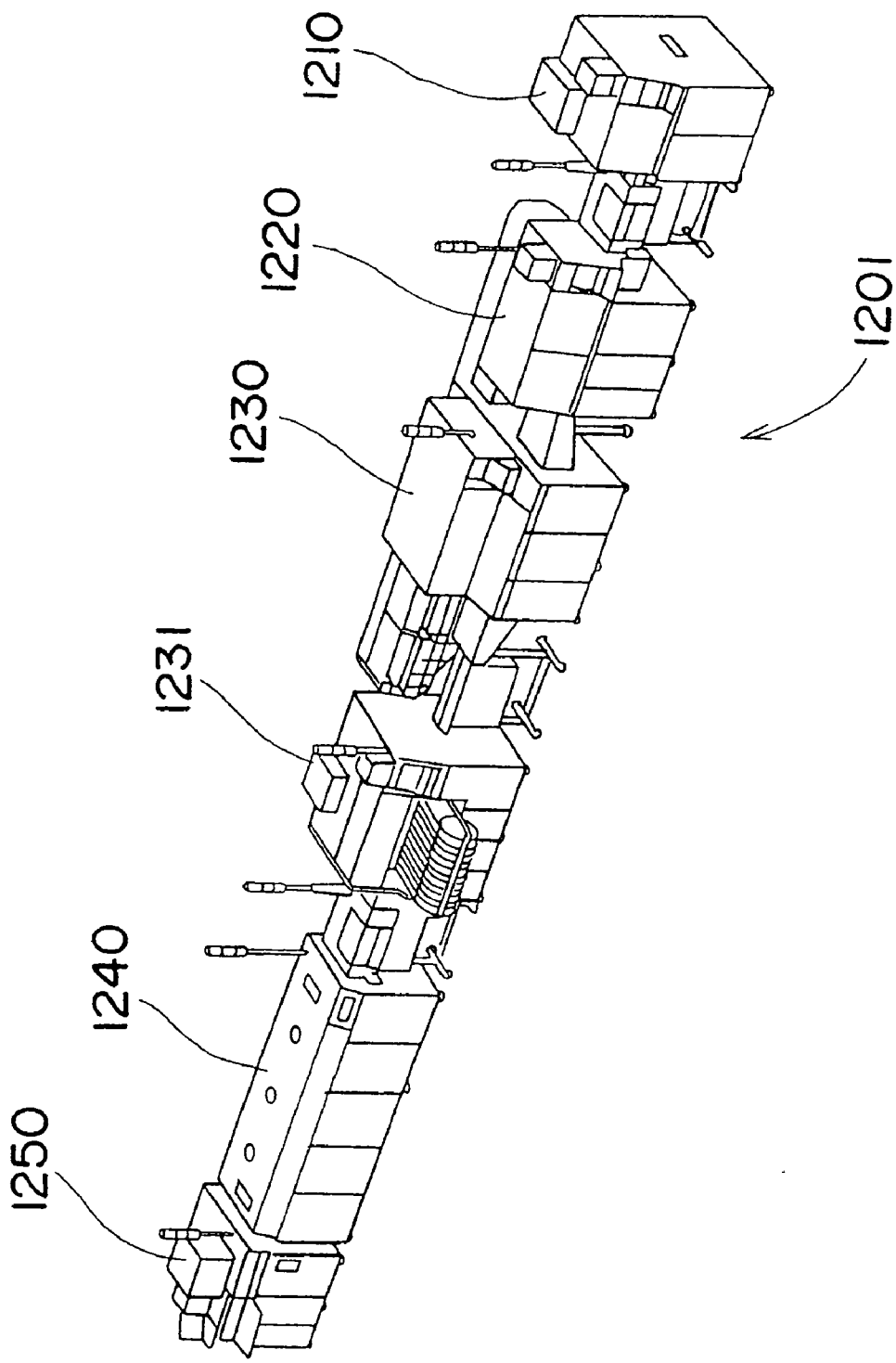
FIG. 18 is a perspective view showing a conventional mounted-board producing apparatus.

In FIG. 18, the mounted-board producing apparatus 1201 includes a plurality of work apparatuses performing predetermined tasks for boards, and also includes a board feeding apparatus 1210, in which a plurality of boards are housed so that the plurality of boards on which electronic components are mounted in the mounted-board producing apparatus 1201 can be fed to an adjacent work apparatus, a printer 1220 for printing cream solder paste on electrodes of a board, electronic component placing apparatuses 1230 and 1231 for placing electronic components on the electrodes of the board via the solders, a reflow apparatus 1240 for fixing the electronic components placed on the board by allowing the solders to reflow, and a board removing apparatus 1250 for removing mounted boards on which electronic components are mounted from the reflow apparatus 1240 and then housing them, in this order from the right side of the figure. Furthermore, these work apparatuses are installed adjacent to each other.

In such a mounted-board producing apparatus 1201, when a mounted board is produced, a plurality of boards on which electronic component are to be mounted are successively carried inside the work apparatuses from the board housing apparatus 1210 to the board removing apparatus 1250, and predetermined tasks are performed for each board in each of the work apparatuses to produce a plurality of mounted boards.

However, in the apparatus having the above structure, when types of mounted boards to be produced are switched, for example, the number of types of electronic components to be placed may be increased to a large number in some cases. In such cases, in the mounted-board producing apparatus 1201, an electronic component placing apparatus for placing an increased number of electronic components needs to be newly added. In this case, in the mounted-board producing apparatus 1201, the reflow apparatus 1240 and the board removing apparatus 1250 are moved, and then the aforementioned new electronic component placing apparatus is positioned for additional installment. Then, according to this position, the installation positions of the reflow apparatus 1240 and the board removing apparatus 1250 need to be adjusted. An issue arises that it is not easy to move the apparatuses since these work apparatuses are heavy.

Furthermore, since each of the work apparatuses constituting the mounted-board producing apparatus 1201 has an individual width along the board carrying direction, for example, when another type of electronic component placing apparatus 1232 is installed to replace the electronic component placing apparatus 1231, the width of the electronic component placing apparatus 1231 and that of the electronic component placing apparatus 1232 may be different from each other. In this case, the reflow apparatus 1240 and the board removing apparatus 1250 also need to be moved, and an issue arises that a replacement work of the work apparatuses constituting the mounted-board producing apparatus 1201 becomes an extensive work, which is not easy.

Accordingly, an object of the present invention is to provide a mounted-board producing apparatus including a plurality of unit apparatuses for performing predetermined tasks for a board and producing a mounted board by mounting electronic components on the board, and an electronic component placing apparatus for a mounted-board producing apparatus as one of the aforementioned unit apparatuses used in the mounted-board producing apparatus, with which each of the unit apparatuses can be easily replaced, moved, and fixed; and positions of the unit apparatuses are easily changed, and thus solve the aforementioned issues.

Hereafter, embodiments of the present invention are explained in detail with reference to the accompanying drawings.

Figure 13:
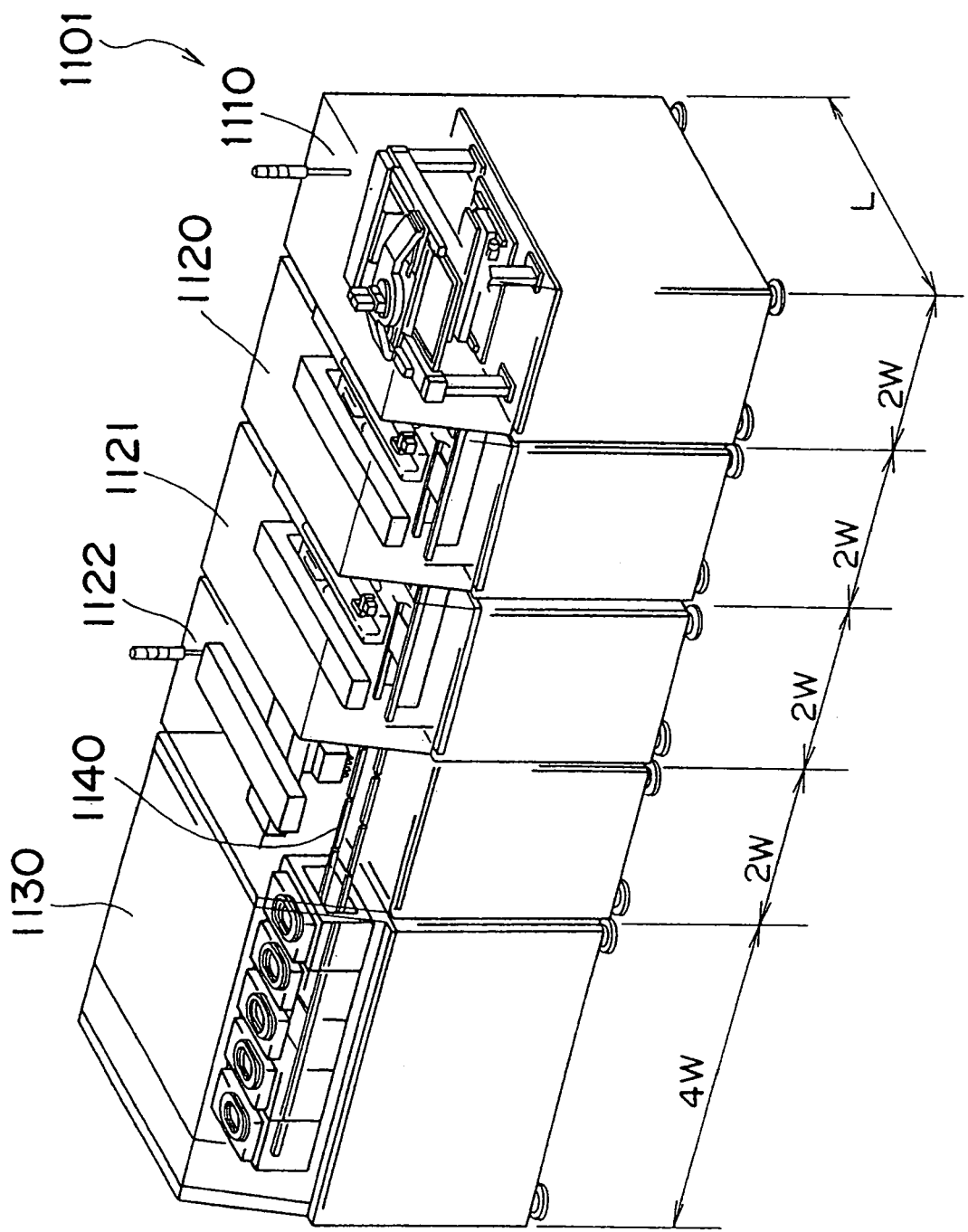
FIG. 13 is a perspective view showing a mounted-board producing apparatus according to a second embodiment of the present invention.

As shown in FIG. 13, the mounted-board producing apparatus 1101 according to the second embodiment of the present invention includes a plurality of unit apparatuses 1001 as one example of unit apparatuses each including a work unit for performing predetermined tasks for the board 8, and includes a printer 1110 for printing cream solder paste on electrodes on a plurality of boards fed into the mounted-board producing apparatus 1101, electronic component placing apparatuses 1120, 1121, and 1122 each equipped with a placement work unit for placing electronic components 99 on the electrodes of the board via the solder, and a reflow apparatus 1130 equipped with a reflow work unit for fixing the electronic components placed on the board via the solders by allowing the solders to reflow, in this order from the right side of the figure. Here, an electronic component placing apparatus constituted by unit apparatuses equipped with the aforementioned placement work units constitutes the electronic component placing apparatus according to the first embodiment.

Since the unit apparatuses each include a carrying device for carrying boards and are installed adjacent to each other, a carrier line 1140 that can sequentially carry a plurality of boards inside the respective unit apparatuses 1001 from the printer 1110 to the reflow apparatus 1130 is formed by the carrying devices included in the respective unit apparatuses 1001.

In such a mounted-board producing apparatus 1101, when mounted boards are produced, a plurality of boards on which electronic components are to be mounted are successively carried inside the respective unit apparatuses 1001 by the carrier line 1140, predetermined tasks are performed for the respective boards in the respective unit apparatuses 1001, and thus a plurality of mounted boards are produced.

Furthermore, as shown in FIG. 13, each of the unit apparatuses 1001 is formed so as to have a width which is an integer number of times of the width W as one example of the basic dimension along the board carrier line 1140 or a width which is 2 or greater integer number of times of the width W. The printer 1110 and the electronic component placing apparatuses 1120, 1121, and 1122 are formed with the width 2W (corresponding to the width AW in the first embodiment), and the reflow apparatus 1130 is formed with a width which is 2 or greater integer number of times of the width W, for example, with a width 4W, which is 4 times of the width. Furthermore, the electronic component placing apparatuses 1120, 1121, and 1122 out of the respective unit apparatuses 1001 are examples of a first unit apparatus 1001a, an the reflow apparatus 1130 is one example of a second unit apparatus 1001b. Furthermore, each of the unit apparatus 1001 is formed in the same length L in the direction perpendicular to the width.

The reflow apparatus 1130 is formed with the width 4W. However, since, generally in a reflow apparatus, heat matching the solder reflow profile needs to be applied to a board being carried, time for carrying the board, that is, a board carrying distance needs to be secured, and thus a width wider than the other unit apparatuses 1001 is required. Instead of forming the reflow apparatus 1130 with the aforementioned width 4W, two reflow apparatuses each with a width 2W may be installed successively. Furthermore, the basic dimension is a dimension defined by the minimum width required in a work unit that is installed on the board carrier line of the mounted-board producing apparatus and can perform a predetermined tasks for the board, for example, the minimum width required by the electronic component placing apparatus. For example, this is a dimension determined in a design stage.

A fixing mechanism and a moving mechanism of a unit apparatus for movably fixing and positioning each of the unit apparatuses 1001 along the carrier line 1140 are explained below.

The unit apparatus 1001 is equipped with fixing units 1010 as one example of fixing mechanisms and moving units 1020 as one example of moving mechanisms on the lower surface of a machine base in the unit apparatus 1001. Explanatory views showing schematic structures of these fixing unit 1010 and moving unit 1020 are shown in FIGS. 14A and 14B.

Figure 14A:
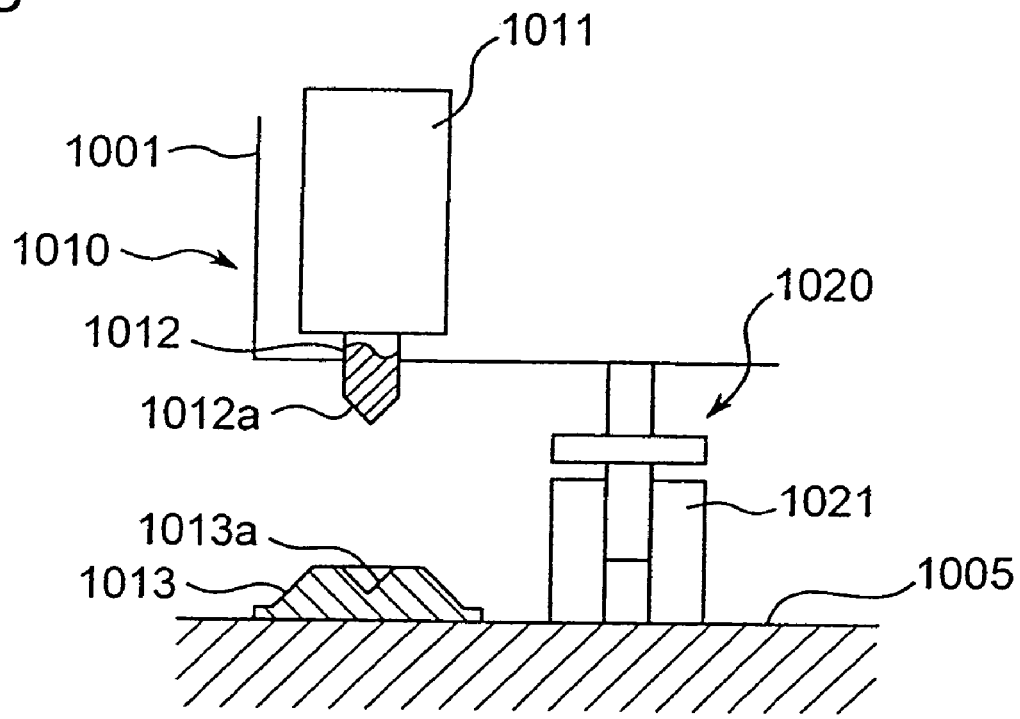
FIGS. 14A and 14B are schematic explanatory views showing structures of a fixing unit and a moving unit, respectively, of a unit apparatus in the second embodiment.
Figure 14B:
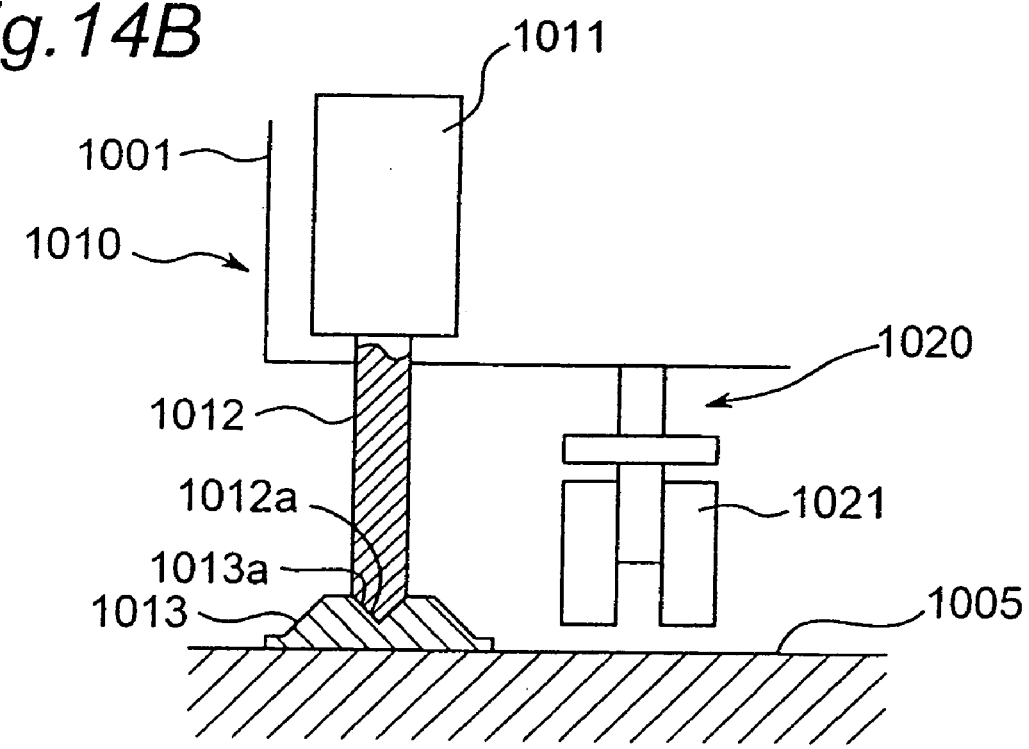

In FIG. 14A, the fixing unit 1010 includes, for example, air cylinders 1011, as one example of a pillar elevation mechanism, fixed at four corners of a frame under the machine base of the unit apparatus 1001 formed with a rectangular frame, round bar-like support legs 1012 each attached to each air cylinder 1011 so as to be lowered from or raised to the frame under the machine base which serves as one example of pillars, and disc-like leg receiving portions 1013, as one example of pillar receiving portions, each of which has on the top surface thereof a depressed portion 1013a that can be engaged with each of ends at the lower portions of the support legs 1012 and is installed on the floor 1005 as one example of an installation surface of the unit apparatus 1001.

The support leg 1012 has a tapered portion 1012a having a conical shape downwards at its lower end. The inside of the depressed portion 1013a of the leg receiving portion 1013 is in a similar mortar shape so as to be engaged with the tapered portion 1012a. Furthermore, the lower surface of the leg receiving portion 1013 is formed so as to receive frictional resistance between this surface and the upper surface of the floor 1005 and hardly slip on the floor.

In FIG. 14A, the moving unit 1020 is equipped with casters 1021 fixed at the four corners of the frame under the machine base as one example of wheels.

Fixing and moving operations of the unit apparatus 1001 by such fixing units 1010 and such moving units 1020 are explained below.

First, as shown in FIG. 14A, when support legs 1012 are simultaneously raised by four air cylinders 1011, the tapered portion 1012a of each support leg 1012 becomes distant from the depressed portion 1013a of each leg receiving portion 1013, and the unit apparatus 1001 is supported by the four casters 1021. Consequently, the unit apparatus 1001 can be moved by the casters 1021.

Subsequently, as shown in FIG. 14B, when the support legs 1012 are simultaneously lowered by the air cylinders 1011, the tapered portion 1012a of each support leg 1012 is engaged with the depressed portion 1013a of each leg receiving portion 1013. When the support legs 1012 are further lowered by the air cylinders 1011 simultaneously, the support legs 1012 are extended to predetermined lowering fixation positions, and the casters 1021 supporting the unit apparatus 1001 are simultaneously lifted from the floor 1005. Consequently, the unit apparatus 1001 is fixed by the fixing units 1010.

At this time, even when a load is applied to the unit apparatus 1001 in the lateral direction, the self-weight of the unit apparatus 1001 is added to the leg receiving portions 1013. Therefore, since frictional resistance between the lower surface of the leg receiving portions 1013 and the floor surface becomes high, and the leg receiving portions 1013 hardly move on the floor, the unit apparatus 1001 is stabilized and fixed.

Furthermore, the support leg 1012 is equipped with the tapered portion 1012a having a conical shape pointing downwards at the lower end portion, and the inside of the depressed portion 1013a of the leg receiving portion 1013 is mortar-shaped. Therefore, even in the case where the positions of the tapered portions 1012a of the support legs 1012 are positioned off the positions of the depressed portions 1013a of the leg receiving portions 1013 when the unit apparatus 1001 is fixed by the fixing units 1010, some displacement is corrected due to these shapes and hence the tapered portions 1012a of the support legs 1012 can be smoothly engaged with the depressed portions 1013a of the leg receiving portions 1013.

The case where the air cylinders 1011 of the fixing units 1010 and the casters 1021 of the moving units 1020 are equipped at the four corners of the frame on the lower surface of the machine base of the unit apparatus 1001 has been explained, but the installation sites and the numbers of the air cylinders 1011 and the casters 1021 are not limited so long as these are equipped on the frame in good balance.

Figure 15A:
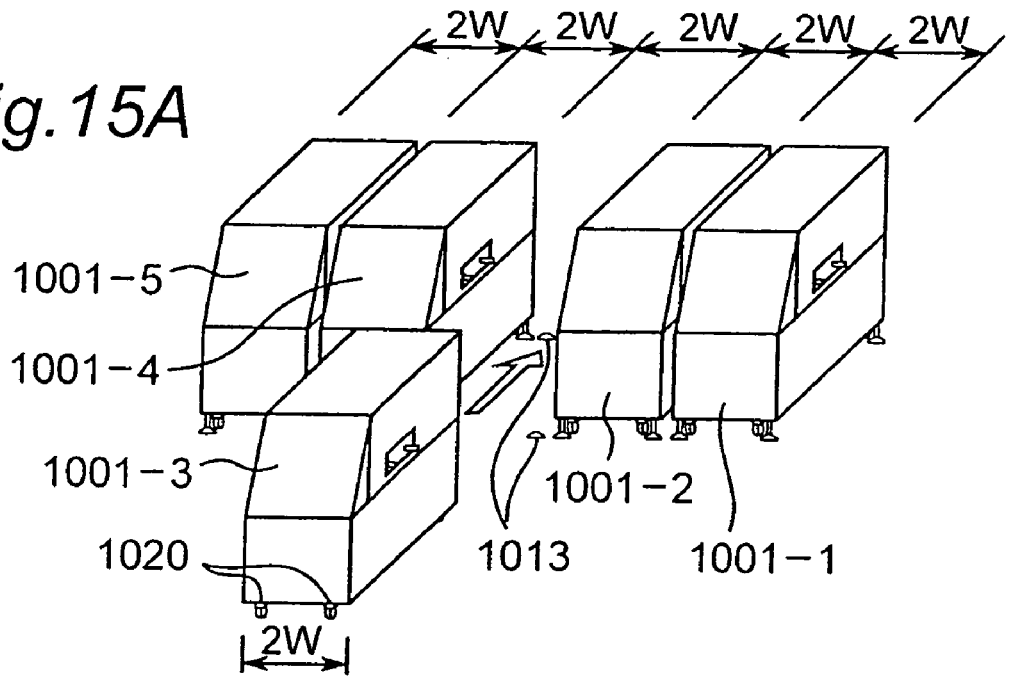
FIGS. 15A, 15B and 15C are schematic explanatory views showing a moving operation and a fixing operation of the unit apparatuses of the second embodiment.
Figure 15B:
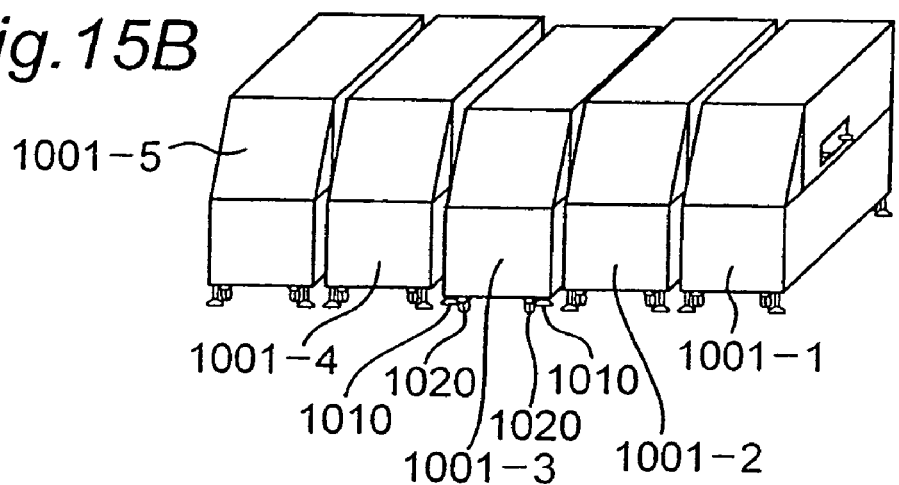
Figure 15C:
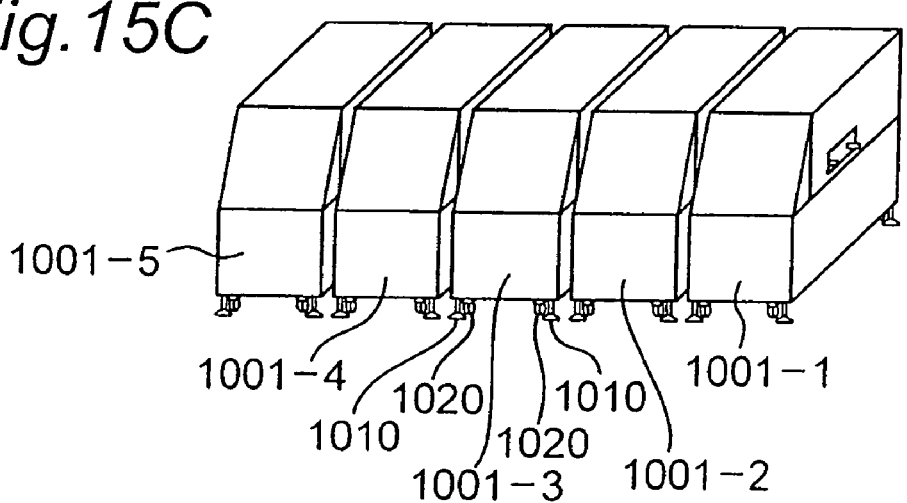

Schematic explanatory view showing procedures of moving and fixing operations of the unit apparatus 1001 in the mounted-board producing apparatus 1101 including a plurality of such unit apparatuses 1001 are show in FIGS. 15–15C.

In FIG. 15A, a plurality of unit apparatuses 1001 each formed with a width 2W are arranged so that unit apparatuses 1001-1 and 1001-2 are positioned adjacent to each other and that unit apparatuses 1001-4 and 1001-5 are positioned adjacent to each other in this order from the right side of the figure, and are fixed by the fixing units 1010 on the floor surface. A space of a width 2W is provided between the unit apparatuses 1001-2 and 1001-4. Four leg receiving portions 1013 are positioned and arranged on the floor surface in this space so that the unit apparatus 1001-3 can be installed.

Subsequently, as shown in FIG. 15B, the unit apparatus 1001-3 is moved by the casters 1021 of the moving units 1020 into a space having the width 2W, the unit apparatus 1001-3 is minutely moved by the casters 1021 so that the tapered portions 1012a of the support legs 1012 of the four fixing units 1010 of the unit apparatus 1001-3 are engaged with the depressed portions 1013a of the leg receiving portions 1013, which are positioned and disposed, and the tapered portion 1012a of each support leg 1012 and the depressed portion 1013a of each leg receiving portion 1013 are aligned.

Subsequently, in the respective fixing unit 1010, the support legs 1012 are simultaneously lowered by the four air cylinders 1011 and each tapered portion 1012a is engaged with the depressed portion 1013a of each leg receiving portion 1013, and the casters 1021 are lifted from the floor 1005 by further lowering the support legs 1012 to the aforementioned lowering fixation positions as shown in FIG. 15C, so that the unit apparatus 1001-3 is supported by the support legs 1012 and fixed on the floor 1005.

Consequently, the unit apparatuses 1001-1 to 1001-5 are positioned adjacent to each other and fixed, the carrying device of the unit apparatuses 1001 are positioned at the same height, and thus the mounted-board producing apparatus in which a single carrier line is formed is constituted.

In each unit apparatus 1001, the aforementioned lowering fixation position of each support leg 1012 is adjusted and set beforehand so that the carrying devices have the same height in all the unit apparatuses 1001 when the support legs 1012 are lowered to the aforementioned lowering fixation positions by the air cylinders 1011.

In the mounted-board producing apparatus constituted by the unit apparatuses 1001, as described above, change in arrangement of the unit apparatuses 1001 or addition or replacement of a unit apparatus can be performed by combining the moving operation by the moving units 1020 and the fixing operation by the fixing units 1010, respectively, of each unit apparatus 1001.

An effect in the case where each of the unit apparatuses 1001 constituting the mounted-board producing apparatus as described above is equipped with a first unit apparatus 1001a having a width which is an integer number of times of the aforementioned width W of the basic dimension and a second unit apparatus 1001b having a width which is 2 or greater integer number of times (integral multiple of 2 or greater) of the aforementioned width W of the basic dimension, so that change of the types of the unit apparatuses 1001 and change in arrangement thereof are performed in the mounted-board producing apparatus is explained below with reference to the following specific example.

FIGS. 16A–16E are explanatory views schematically showing arrangement of the unit apparatuses in the mounted-board producing apparatus. First, in FIG. 16A, the mounted-board producing apparatus 1101a includes a printer 1003-1 having a width W, a chip component placing apparatus 100la-I having a width 2W as one example of an electronic component placing apparatus, a chip component placing apparatus 1001a-2 having the width 2W, and a reflow apparatus 1001b-1 having a width 4W, in this order from the right side to the left side of the figure. The total length of the mounted-board producing apparatus 1101a in the width direction is 9W.

Figure 16A:
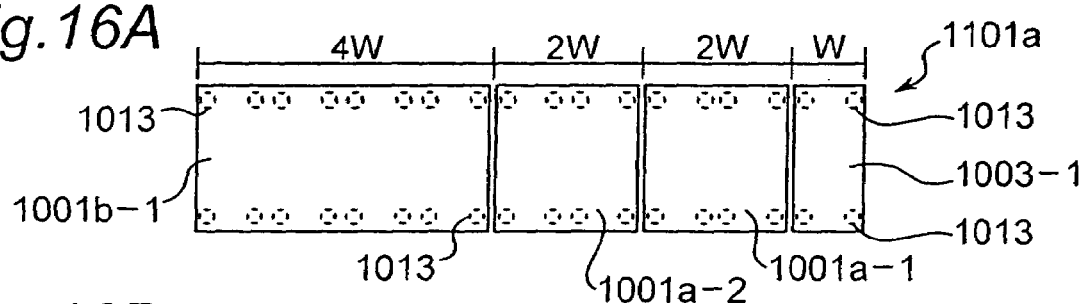
FIGS. 16A, 16B, 16C, 16D and 16E are schematic plan views showing arrangement of unit apparatuses in the mounted-board producing apparatus of the second embodiment.
Figure 16B:
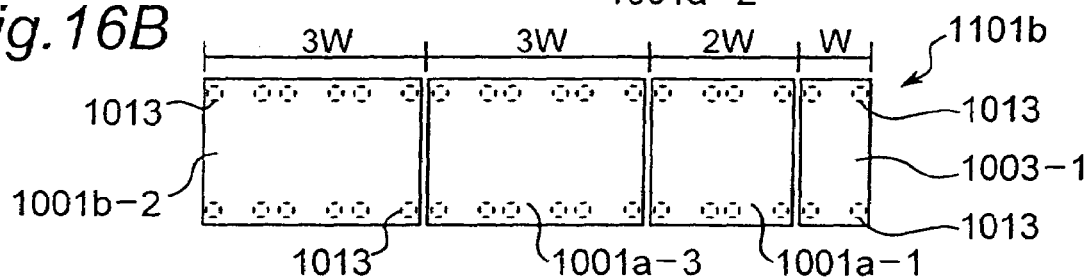

In a mounted-board producing apparatus 1101a having such a constitution, when the type of the unit apparatus 1001 is changed along with change of the types of electronic components to be mounted, change of the types of boards to be produced, or the like, a mounted-board producing apparatus 1101b having the same total length as the total length 9W of the mounted-board producing apparatus 1101a can be constituted without changing the arrangement of the printer 1003-1 and the chip component placing apparatus 1001a-1, of which types are not changed, as shown in FIG. 16B, by replacing the chip component placing apparatus 1001a-2 having the width 2W by an IC placing apparatus 1001a-3 having a width 3W as one example of an electronic component placing apparatus and by replacing the reflow apparatus 1001b-1 having the width 4W by a reflow apparatus 1001b-2 having a width 3W.

Figure 16C:
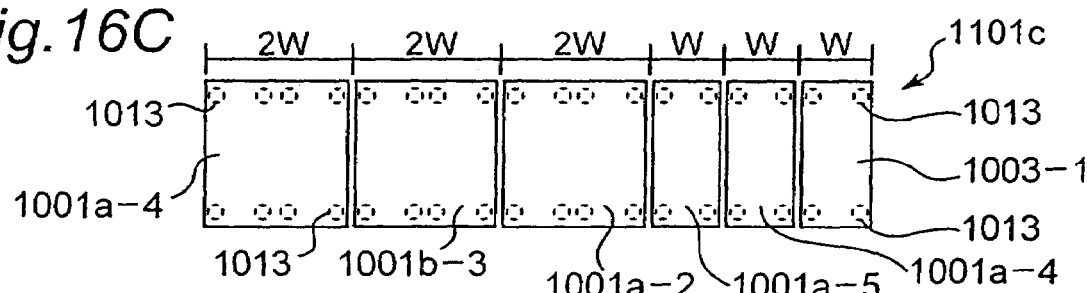

Furthermore, in the mounted-board producing apparatus 1101a, as another example of the case where the types are changed as described above, a mounted-board producing apparatus 1101c having the same total length as the total length 9W of the mounted-board producing apparatus 1101a can be constituted without changing the printer 1003-1 and the chip component placing apparatus 1001a-2, of which types are not changed, by replacing the chip component placing apparatus 1001a-1 having the width 2W by a chip component placing apparatus 1001a-4 having a width W and a chip component placing apparatus 1001a-5 having a width W, and by replacing the reflow apparatus 1001b-1 having the width 4W by the reflow apparatus 1001b-3 having a width 2W and a reflow apparatus 1001b-4 having a width 2W, as shown in FIG. 16C.

Figure 16D:
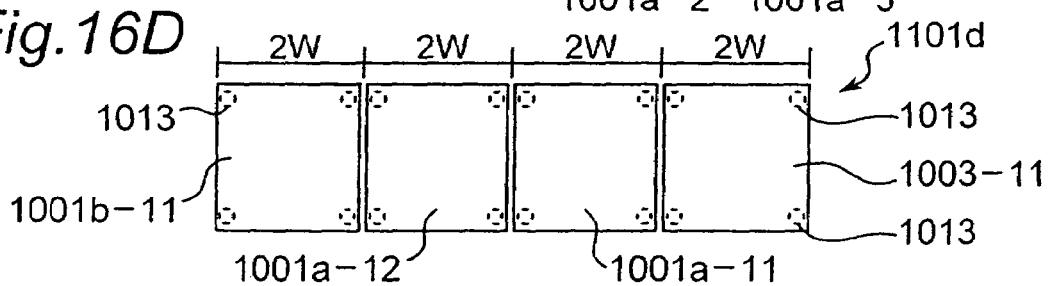

Furthermore, as shown in FIG. 16D, a mounted-board producing apparatus 1101d includes a printer 1003-11 having a width 2W, a chip component placing apparatus 1001a-11 having a width 2W, a chip component placing apparatus 1001a-12 having a width 2W, and a reflow apparatus 1001b-11 having a width 2W from the right side to the left side in this order in the figure. In the mounted-board producing apparatus 1101d, all the unit apparatuses 1001 are constituted with the width 2W.

Figure 16E:
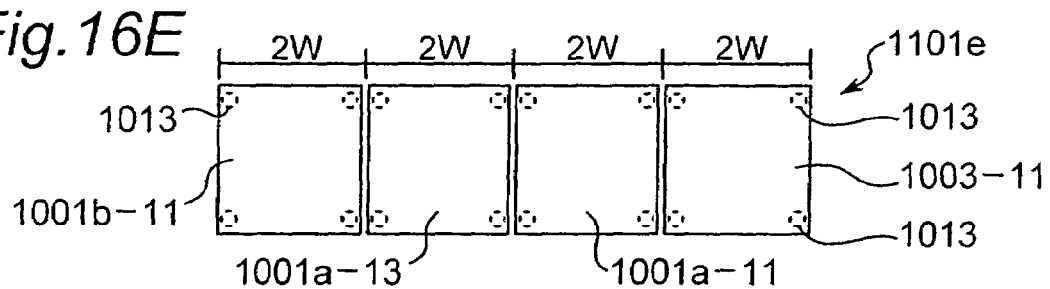

In such a mounted-board producing apparatus 1101d, for example, when only a chip component placing apparatus 1001a-12 is replaced by an IC placing apparatus of a different type, by using an IC placing apparatus 1001a-13 constituted with the same width 2W as that of the chip component placing apparatus 1001a-12 as the IC placing apparatus, the IC placing apparatus 1001a-13 can be installed without moving the unit apparatuses 1001 other than the chip component placing apparatus 1001a-12 in the mounted-board producing apparatus 1101d as shown in FIG. 16E to constitute a mounted-board producing apparatus 1101e.

Furthermore, as shown in FIGS. 16A to 16C, when the leg receiving portions 1013 of the fixing units 1010 of each unit apparatus 1001 are preset with a pitch of a basic dimension W, which is the minimum unit of the width of the unit apparatus 1001, on the floor surface on which the mounted-board producing apparatus is to be installed, the unit apparatus installation position can be easily determined when a change in position, replacement, or the like of a unit apparatus is performed in the mounted-board producing apparatus.

According to the second embodiment, each of the unit apparatuses 1001 constituting the mounted-board producing apparatus is not formed with each individual width unlike each work apparatus in a conventional apparatus, but formed with a width which is an integer number of times of the width W as one example of the basic dimension or with a width which is 2 or greater integer number of times of the width W. Therefore, for example, when one or a plurality of unit apparatuses 1001 are replaced among a plurality of arranged unit apparatuses 1001, the one or plurality of unit apparatuses 1001 are moved, and then, in a space of the positions at which the one or plurality of unit apparatuses 1001 are arranged before, one or a plurality of new unit apparatuses 1001 of which total length is constituted by the width of the space, that is, a width an integer number of times of the width W can be arranged. Therefore, in a position change, or replacement, or the like of one or a plurality of unit apparatuses in the mounted-board producing apparatus, there can be no or little influence on positions of unit apparatuses that are not subjected to a position change work, replacement, or the like, and thus a mounted-board producing apparatus in which the position change, replacement, or the like of unit apparatuses can be easily performed can be provided.

Furthermore, there can be provided a mounted-board producing apparatus in which, by including fixing units and moving units for movably fixing and positioning each unit apparatus in each unit apparatus constituting the mounted-board producing apparatus, fixing and moving the unit apparatus formed with a width an integer number of times of the aforementioned certain width W or a width of an integer number which is 2 or greater of times of the certain width W can be easily performed, and a change in position or the like of the unit apparatus can be easily performed.

Furthermore, by including air cylinders 1011 in the fixing units 1010 of the unit apparatus 1001 as a mechanism for raising and lowering support legs 1012 that can support and fix the unit apparatus 1001, the air cylinders 1011 are simultaneously operated, and hence simultaneous raising or lowering operations of the support legs 1012 can be easily performed. Therefore, there can be provided a mounted-board producing apparatus in which fixing and moving operations of the unit apparatus 1001 can be easily and stably performed and a change in position or the like of the unit apparatus can be easily and smoothly performed.

Furthermore, when the leg receiving portions 1013 of the fixing units 1010 of each unit apparatus 1001 are preset with a pitch of the basic dimension W, which is the minimum unit of the width of the unit apparatus 1001, on the floor surface, on which the mounted-board producing apparatus is to be installed, the installation position of the unit apparatus 1001 can be easily determined when a change in position, replacement, or the like of a unit apparatus is performed in the mounted-board producing apparatus.

The scope of the present invention is not limited to the above embodiment and can be applied in other various aspects. For example, unit apparatuses 1050 constituting a mounted-board producing apparatus according to a third embodiment of the present invention include a fixing unit 1060 having a different structure from that of the fixing unit 1010 in the unit apparatus 1001 constituting the mounted-board producing apparatus in the second embodiment, and other components are the same as those of the unit apparatus 1001. Therefore, only this different fixing unit 1060 is explained below.

Figure 17A:
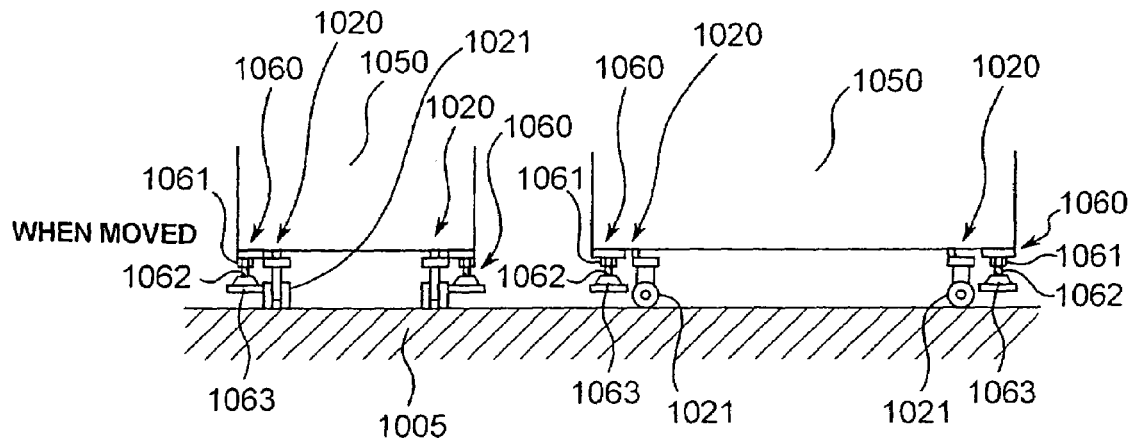
FIGS. 17A and 17B are schematic explanatory views showing structures of a fixing unit and a moving unit, respectively, of unit apparatuses in a mounted-board producing apparatus according to a third embodiment of the present invention.
Figure 17B:
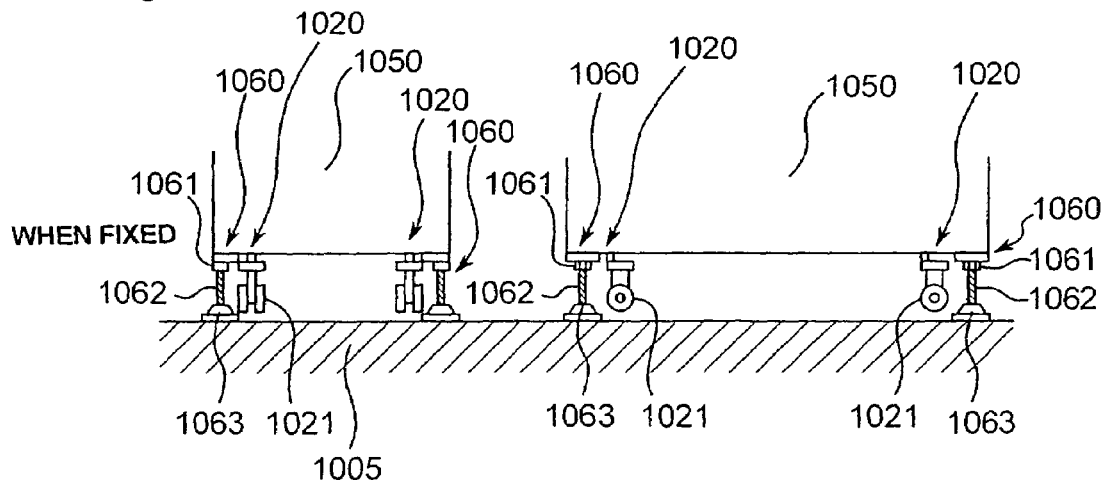

FIGS. 17A and 17B are explanatory views showing respective structures of fixing units 1060 as one example of fixing mechanisms and moving units 1020 as one example of moving mechanisms, which are provided to the lower surfaced of the machine base of the unit apparatus 1050.

In FIG. 17A, the fixing units 1060 each include, for example, a nut 1061 fixed at each of four corners of a frame formed with a frame in a rectangular shape under the machine base of the unit apparatus as one example of a pillar elevation mechanism, a screw shaft 1062 engaged with and attached to each nut 1061 so as to be vertically movable downwards from the frame under the machine base as one example of a pillar, and a disc-like bearing board 1063 attached to a lower end portion of the screw shaft 1062 as one example of a pillar receiving portion. The lower surfaces of the bearing boards 1063 are formed so as to receive frictional resistance between these surfaces and the upper surface of the floor 1005 as one example of an installation surface of the unit apparatus 1050 and hardly slip on the floor surface.

In FIG. 17A, the moving units 1020 are the same as the moving units 1020 of the second embodiment and include casters 1021 fixed at four corners of the frame under the machine base as one example of wheels.

Fixing and moving operations of the unit apparatus 1005 by such fixing units 1060 and moving units 1020 are explained below.

First, as shown in FIG. 17A, since the screw shafts 1062 respectively engaged with the four nuts 1061 are simultaneously rotated relatively to the nuts 1061, the screw shafts 1062 are simultaneously raised between the nuts 1061 and the floor 1005, the bearing boards 1063 attached to the end portions of the screw shafts 1062 become distant from the floor 1005, and the unit apparatus 1050 is supported by the four casters 1021. Consequently, the unit apparatus 1050 can be moved by the casters 1021.

Subsequently, as shown in FIG. 17B, since the screw shafts 1062 respectively engaged with the four nuts 1061 are simultaneously rotated relatively to the nuts 1061, the screw shafts 1062 are simultaneously lowered between the nuts 1061 and the floor 1005, the bearing boards 1063 attached to the end portions of the screw shafts 1062 is brought into contact with the upper surface of the floor 1005, the screw shafts 1062 are simultaneously lowered between the nuts 1061 and the floor 1005 by further rotating the screw shafts 1062 relatively and simultaneously to the nuts 1061, and the unit apparatus 1050 is fixed by the fixing units 1060 by lifting the casters 1021 supporting the unit apparatus 1050 from the upper surface of the floor 1005.

At this time, even when a load is applied to the unit apparatus 1050 in the lateral direction, a self-weight of the unit apparatus 1005 is applied to the bearing boards 1063. Therefore, since frictional resistance between the lower surface of the bearing board 1063 and the floor surface is increased and the bearing board 1063 hardly moves on the floor surface, the unit apparatus 1050 is stably fixed.

Since procedures of the moving and fixing operations of the unit apparatus 1050 in such a mounted-board producing apparatus including a plurality of unit apparatuses 1050 are the same as in the second embodiment, the explanation thereof is omitted.

In order to make the carrying devices of the unit apparatuses 1050 in the same height when the unit apparatuses 1050 are serially disposed and fixed, each screw shaft 1062 is rotated relatively to each nut 1061 in the fixing units 1060 of each unit apparatus 1050 to adjust the height of the carrying device.

Furthermore, in the fixing unit 1060, instead of attaching the bearing board 1063 to the end portion of the screw shaft 1062, the bearing board 1063 may be installed on the floor 1005 and include a depressed portion that can be engaged with the lower end portion of the screw shaft 1062, on the upper surface thereof as in the case of the leg receiving portion 1013 of the second embodiment.

According to the third embodiment, as in the case of the effect of the second embodiment, each of the unit apparatuses 1001 constituting the mounted-board producing apparatus is not formed with each individual width unlike each work apparatus in a conventional apparatus, but formed with a width which is an integer number of times of the width W as one example of the basic dimension or with a width which is 2 or greater integer number of times the width W. Therefore, for example, when one or a plurality of unit apparatuses 1001 are replaced among a plurality of arranged unit apparatuses 1001, the one or plurality of unit apparatuses 1001 are moved, and then, in a space of the position at which the one or plurality of unit apparatuses 1001 are arranged before, one or a plurality of new unit apparatuses 1001 of which total width is the width of the space, that is, a width which is an integer number of times of the width W can be arranged. Therefore, in a position change, replacement work, or the like of one or a plurality of unit apparatuses in the mounted-board producing apparatus, there can be no or little influence on positions of the unit apparatuses that are not subjected to a change in position, replacement, or the like, and thus a mounted-board producing apparatus in which the position change, replacement or the like of unit apparatuses can be easily performed can be provided.

Furthermore, there can be provided a mounted-board producing apparatus in which, by including fixing units and moving units for movable fixing and positioning the unit apparatus in each of the unit apparatuses constituting the mounted-board producing apparatus, fixing and moving works of a unit apparatus formed with a width which is an integer number of times of the aforementioned basic dimension W and a width which is 2 or greater integer number of times of the width W can be easily performed and position changes or the like of the unit apparatus can be easily performed.

In addition, the air cylinders are not used in the fixing units unlike in the second embodiment, but the screw shafts can be raised or lowered by reciprocally (forwardly and reversely) rotating the screw shafts relatively to the nuts by using a simple mechanism of the nuts and the screw shafts. Therefore, manufacturing costs of the unit apparatus can be reduced.

According to the 13th aspect of the present invention, since each of the unit apparatuses constituting the mounted-board producing apparatus is not formed with each individual width unlike each work apparatus in a conventional apparatus, but the mounted-board producing apparatus includes the first unit apparatus having a dimension of an integer number of times of the basic dimension along the board carrying direction and a second unit apparatus having a dimension which is 2 or greater integer number of times of the basic dimension as the unit apparatuses. Therefore, for example, when one or a plurality of unit apparatuses 1001 are replaced among a plurality of arranged unit apparatuses 1001, the one or plurality of unit apparatuses 1001 are moved, and then, in a space of the position at which the one or plurality of unit apparatuses 1001 are arranged, one or a plurality of new unit apparatuses 1001 of which total width dimension is the dimension of the space in the carrying direction, that is, a width an integer number of times of the basis dimension can be arranged. Therefore, in a position change, replacement work, or the like of the one or a plurality of unit apparatuses in the mounted-board producing apparatus, there can be no or little influence on positions of the unit apparatuses that are not subjected to the position change work, replacement, or the like, and thus a mounted-board producing apparatus in which a position change, replacement work, or the like of the unit apparatus can be easily performed can be provided.

Furthermore, according to the 14th aspect or the 15th aspect of the present invention, in addition to the effect of the first aspect, there can be provided a mounted-board producing apparatus in which, by including a fixing mechanism and a moving mechanism for movably fixing and positioning the unit apparatus in each of the unit apparatuses constituting the mounted-board producing apparatus, fixing and moving the unit apparatus formed with a width an integer number of times of the aforementioned basic dimension and a width which is 2 or greater integer number of times of the basic dimension can be easily performed and changing position or the like of the unit apparatus can be easily performed.

According to the 16th aspect of the present invention, by including the cylinders in the fixing mechanism of the unit apparatus as a pillar projection-and-retreat mechanism for raising or lowering the pillars that can support and fix the unit apparatus, the cylinders are simultaneously operated, and hence simultaneous raising or lowering operations of the respective pillars can be easily performed. Therefore, there can be provided a mounted-board producing apparatus in which fixing and moving the unit apparatus can be easily and stably performed and changing position or the like of the unit apparatus can be easily and smoothly performed.

According to the 17th aspect of the present invention, by using a simple mechanism of nuts and screw shafts as the fixing mechanism of the unit apparatus, manufacturing costs of the unit apparatus can be reduced, and thus a mounted-board producing apparatus in which changing position or the like of the unit apparatus can be easily performed can be provided at low costs.

According to the 18th aspect of the present invention, by including the pillar receiving portions each having the depressed portion that can be engaged with the end portion of each pillar projected and retreated by each pillar projection-and-retreat mechanism in the fixing mechanism of the unit apparatus, the respective pillar receiving portions can be preset on the installation surface at a position at which the unit apparatus is fixed when moving and fixing operations of the unit apparatus are performed, and the position at which the unit apparatus is fixed can be easily determined. Thus there can be provided a mounted-board producing apparatus in which the unit apparatus can be fixed without damaging the installation surface by the end portion of each pillar supporting and fixing the unit apparatus and changing position or the like of the unit apparatus can be easily performed.

According to the 19th aspect of the present invention, since the electronic component placing apparatus for a mounted-board producing apparatus used in the mounted-board producing apparatus includes the fixing mechanism and the moving mechanism which movably fix and position the electronic component placing apparatus, fixing and moving the electronic component placing apparatus can be easily performed, and there can be provided an electronic component placing apparatus for a mounted-board producing apparatus in which changing position or the like of the electronic component placing apparatus can be easily performed.

Fourth to Sixth Embodiments

The fourth to sixth embodiments of the present invention relate to the structures of the electronic component placing apparatuses according to the first to third embodiments, which places electronic components 99 on a circuit board 8.

In recent years, high-speed and precise mounting of electronic components has been required in electronic component mounting.

Figure 19:
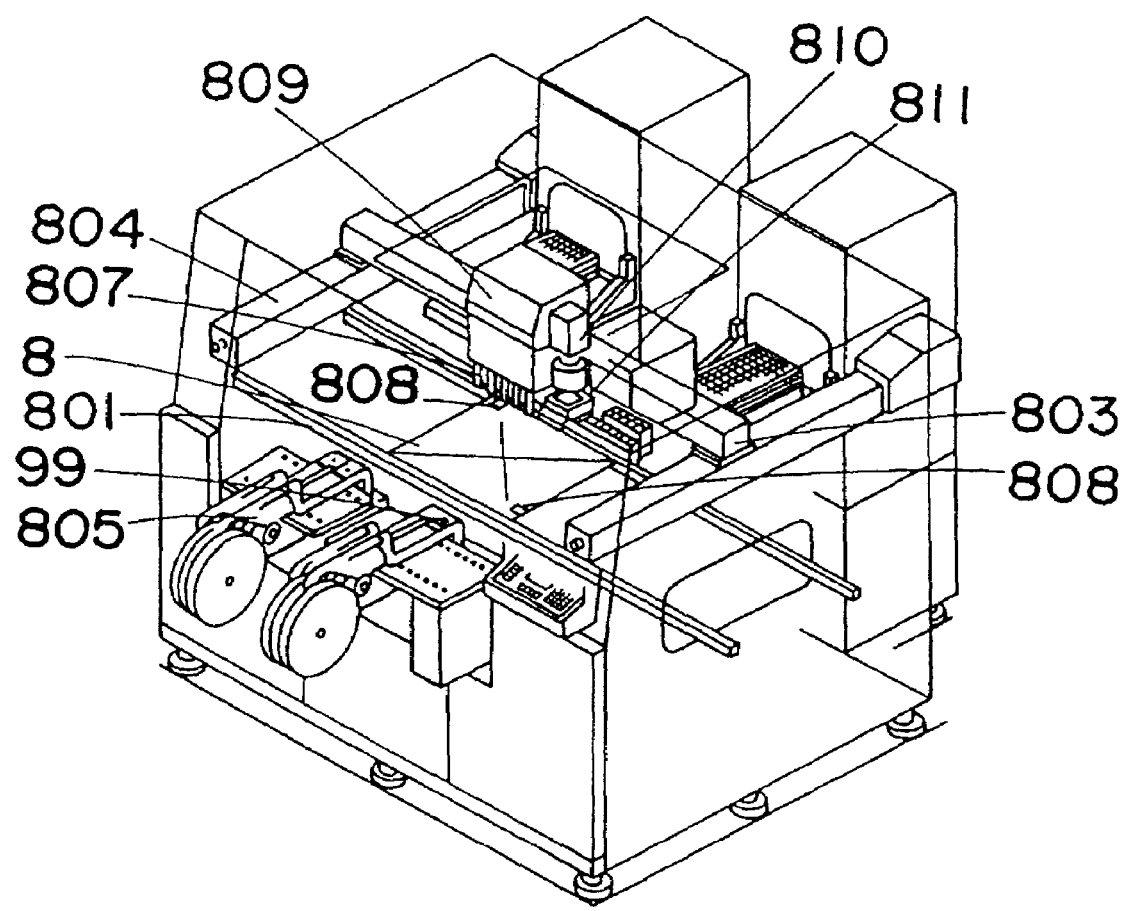
FIG. 19 is a general schematic perspective view showing a conventional electronic component placing apparatus.

A conventional electronic component placing apparatus is explained below with reference to FIG. 19. FIG. 19 is a general schematic view showing an electronic component placing apparatus. In FIG. 19, reference numeral 801 denotes a carrying unit for carrying in and out an electronic circuit board 8. Reference numeral 803 denotes an X-axis ball screw shaft. Reference numeral 804 denotes a Y-axis ball screw shaft. This apparatus is constituted such that nozzles 807 for sucking and placing electronic components 99 from a component feeding unit 805 and a board recognition camera 810 for measuring a position of board marks 808 provided on the electronic circuit board 8 are positioned to arbitrary positions above the electronic circuit board 8 by an X-Y robot constituted by these one X-axis shafts and two Y-axis shafts.

Furthermore, reference numeral 811 denotes a component recognition camera for measuring suction attitudes of the electronic components 99.

Operations of the electronic component placing apparatus constituted as above are explained below. First, the electronic circuit board 8 is carried in to a predetermined position by the carrying unit 801. The X-Y robot moves the board recognition camera 810 provided at the head 809 to above the board marks 808 provided on the electronic circuit board 8. Here, the board recognition camera 810 measures the position of the electronic circuit board 8, and correcting of positions at which the electronic components 99 are to be placed is performed. Subsequently, the X-Y robot moves to above the feeding unit 805, lowers the nozzles 807 and sucks the electronic components 99, thereafter moves to above the component recognition camera 811, picks up images of the suction attitudes of the electronic components 99, and performs correction, and then the electronic components 99 are placed onto the electronic circuit board 8.

However, the electronic component placing apparatus having the above constitution has the following issues.

First, as described above and shown in FIG. 20, the X-Y robot type component placing apparatus is constituted by the one X-axis ball screw shaft 803 and the two Y-axis ball screw shafts 804 disposed under both sides thereof, which is an equipment structure that the equipment frame is made larger since the two Y-axis ball screw shafts 804 move the X-axis ball screw shaft 803. Furthermore, a space for installing a motor is required in the X-axis ball screw shaft 803, which is also a cause to make the equipment frame larger.

Figure 20:
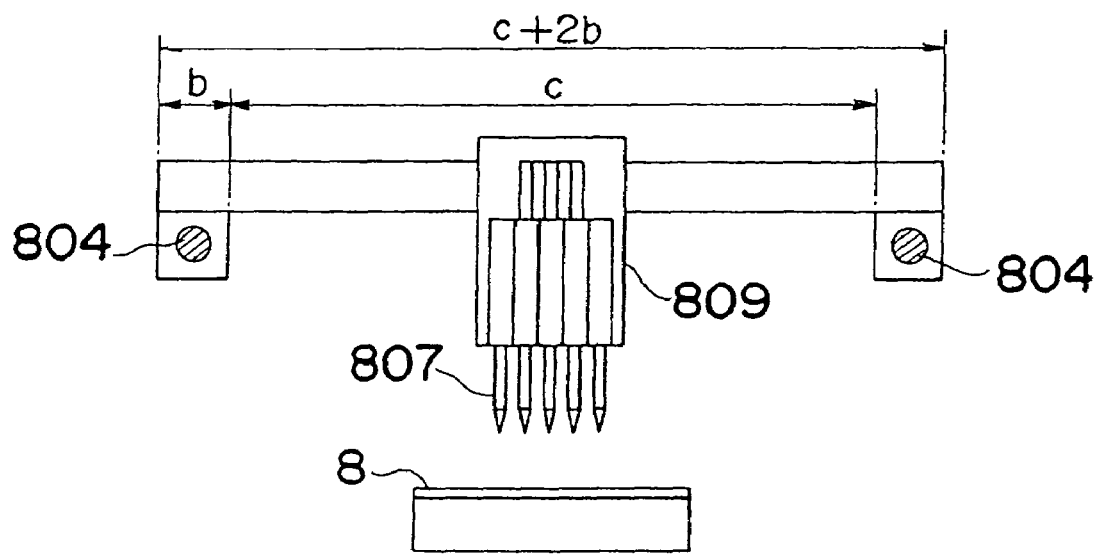
FIG. 20 is a structural view showing a conventional X-Y robot in the electronic component placing apparatus.
Figure 21:
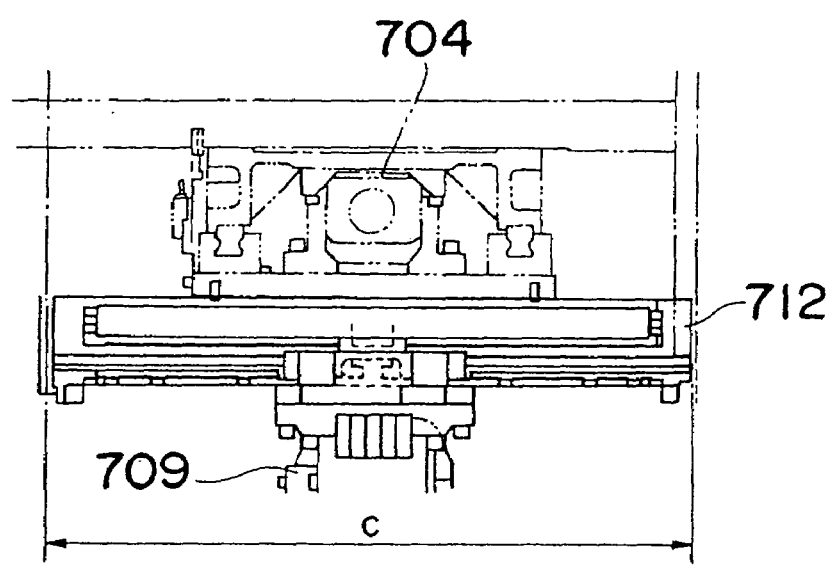
FIG. 21 is a detailed structural view showing an X-Y robot of an electronic component placing apparatus according to a fourth embodiment of the present invention.
Figure 22:
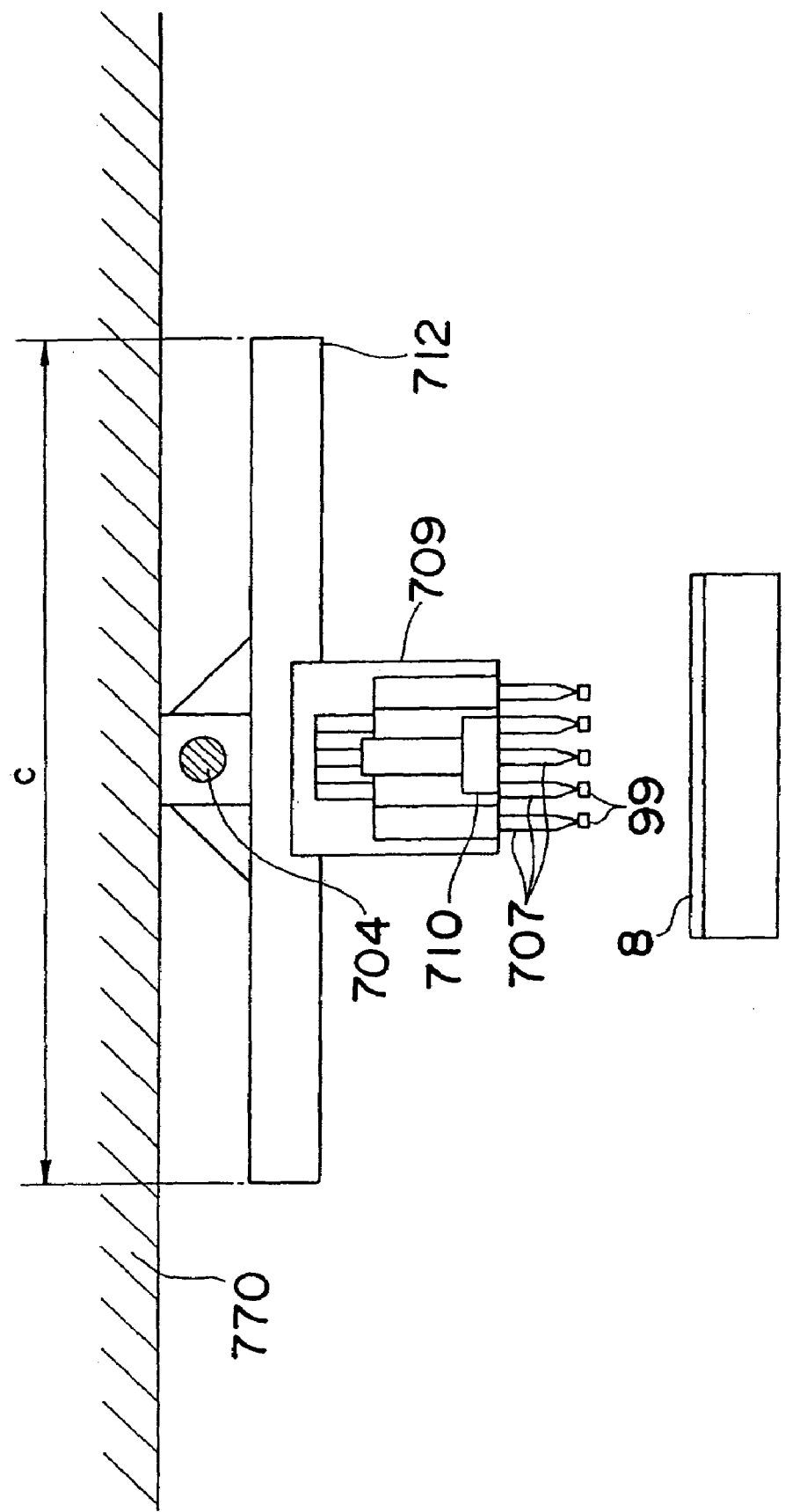
FIG. 22 is a schematic structural view showing the X-Y robot of the electronic component placing apparatus according to the fourth embodiment of the present invention.
Figure 23:
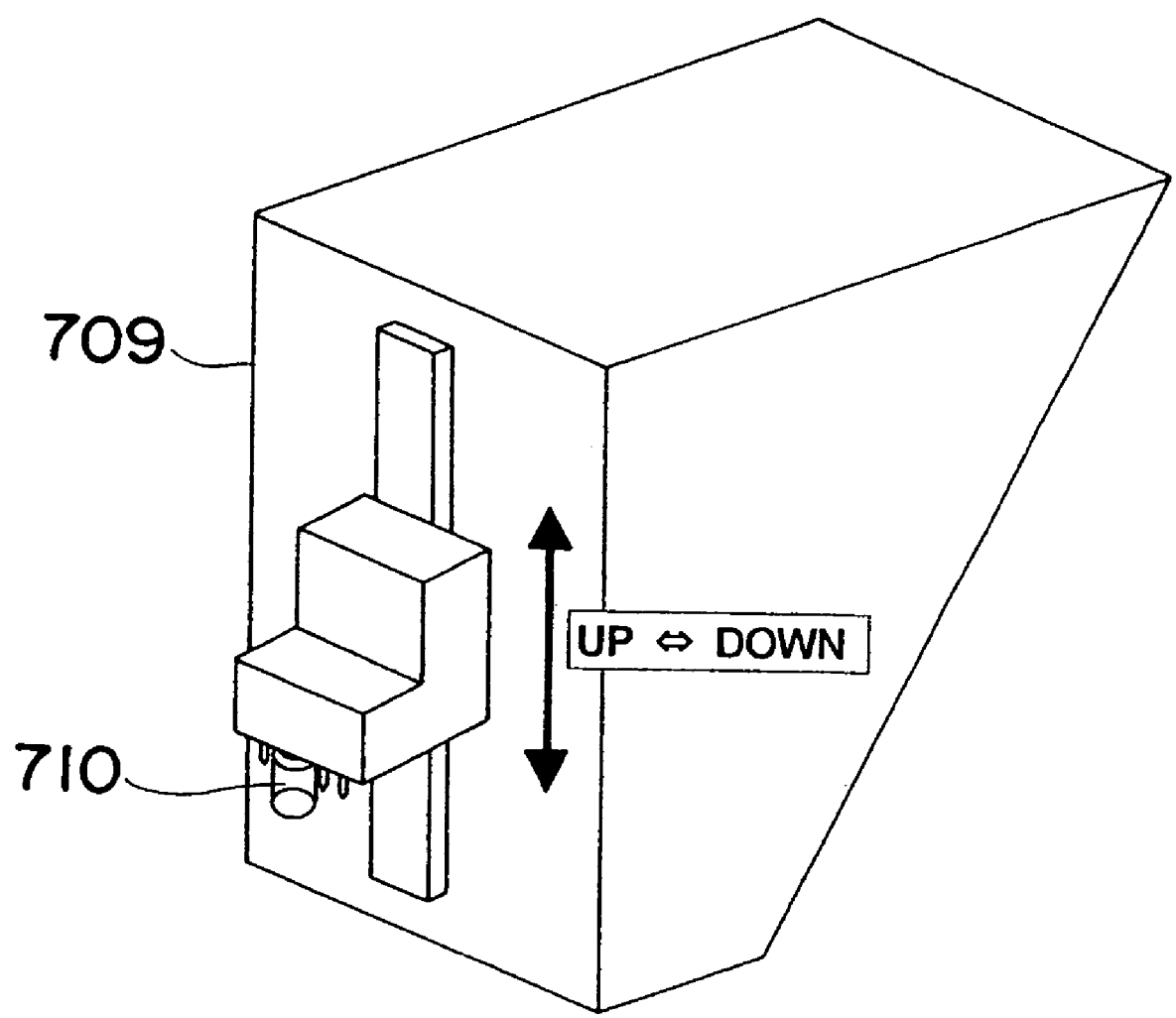
FIG. 23 is a schematic perspective view showing a head unit supported by the X-Y robot of the electronic component placing apparatus in the fourth embodiment of the present invention, from which nozzles are omitted.
Figure 24:
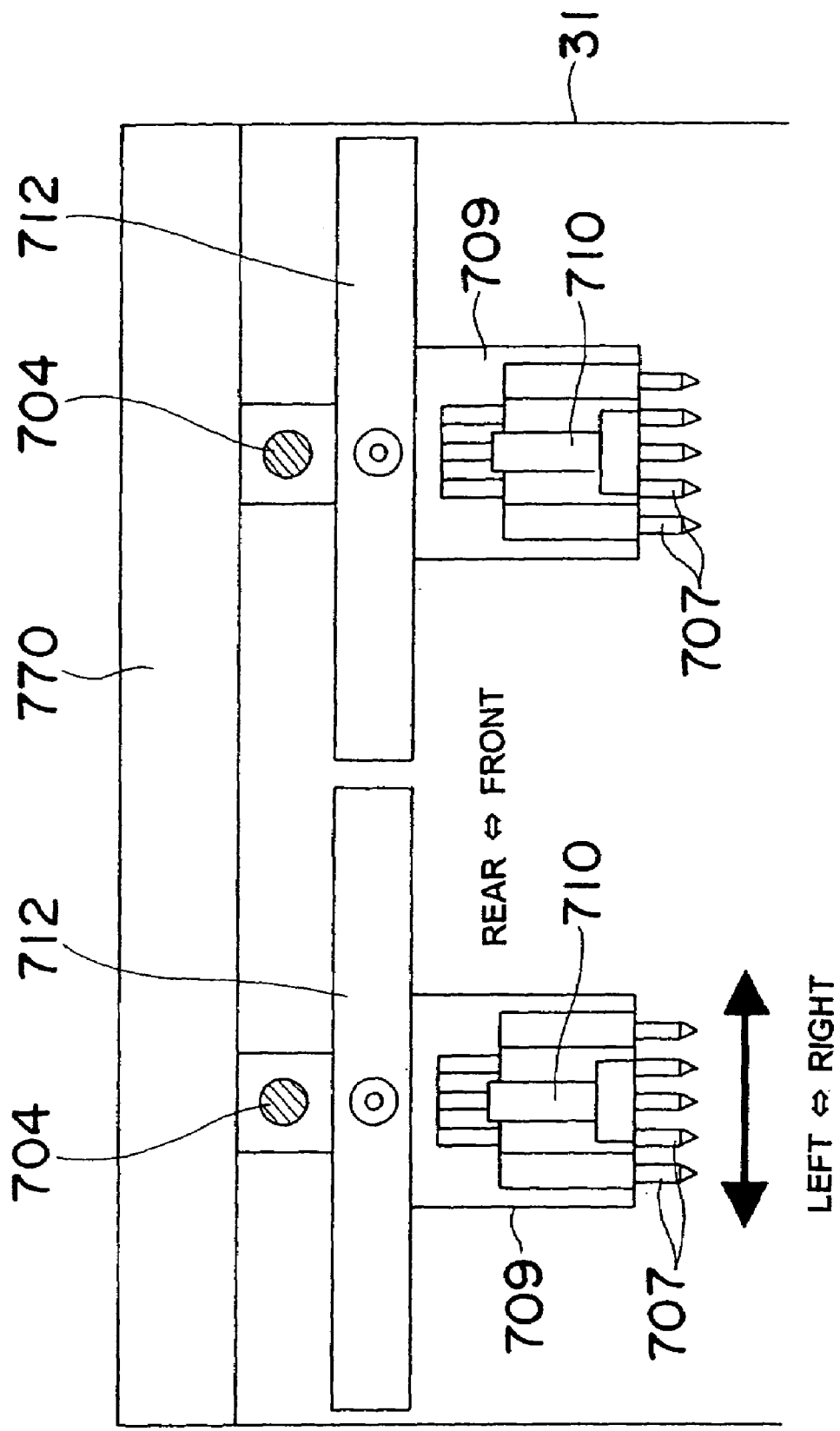
FIG. 24 is a structural view showing an X-Y robot of a specific example where the fourth embodiment of the present invention is applied to the electronic component placing apparatus of the first embodiment.

Furthermore, in the X-Y robot type component placing apparatus shown in FIG. 20, in a head 809 having a plurality of nozzles 807 arranged in one line or a plurality of lines in the X direction, the board recognition camera 810 is installed on an extension of the nozzle line in the X direction, and there is an issue that strokes for attaching and sucking the electronic component 99 in the X direction are small.

An object of the fourth to sixth embodiments of the present invention is to provide an electronic component placing apparatus with which area productivity can be improved, and thus the aforementioned conventional issues can be solved.

FIGS. 21–26 show the embodiments of the present invention.

The fourth embodiment of the present invention is explained below with reference to the drawings.

FIGS. 21–24 show the fourth embodiment of the present invention, and are structural views showing an X-Y robot for moving a head unit 709 to an arbitrary position. As shown in FIGS. 21–24, the X-Y robot for moving the head unit 709 having a placement unit having a plurality of nozzles 707 for sucking and placing a plurality of electronic components 99 and a board recognition camera 710 as one example of a recognition unit to arbitrary positions is constituted by a Y-axis ball screw shaft 704 and an X-axis linear motor 712. This X-Y robot is disposed as a ceiling suspended type, which is suspended from an apparatus ceiling 770. Specifically, one Y-axis ball screw shaft 704 is suspended from the apparatus ceiling 770, and one X-axis linear motor 712 is similarly disposed below the Y-axis ball screw shaft 704.

Operations of the electronic component placing apparatus according to the fourth embodiment having the above constitution are explained with reference to FIGS. 21–24.

The X-Y robot constituted as described above can move in the X direction and the Y direction. As to the Y direction, the X-Y robot can move to the penetrating front and rear sides of the drawing sheet by the Y-axis ball screw shaft 704 as one example of a Y-axis direction moving apparatus. Furthermore, as to the X direction, the X-Y robot can move in the left and right direction of the drawing sheet by the X-axis linear motor 712 provided below one suspended Y-axis ball screw shaft 704 as one example of an X-axis direction moving apparatus. The whole robot can move to a target arbitrary position since the X-axis linear motor 712 and the Y-axis ball screw shaft 704 move independently to arbitrary positions.

Differences between the electronic component placing apparatus according to the fourth embodiment of the present invention and a conventional electronic component placing apparatus are explained below with reference to FIG. 20 and FIGS. 21–24. FIG. 20 is a structural view showing a conventional X-Y robot. As shown in FIG. 20, the conventional X-Y robot is constituted by one X-axis ball screw shaft 803 and two Y-axis ball screw shafts 804 provided perpendicular to the X-axis ball screw shaft 803 and under the both sides thereof. There is a mechanism for movement in the Y direction, the X-axis ball screw shaft 803 moves on the two Y-axis ball screw shafts 804 provided on the left and right sides so that a head 809 that has nozzles 807 and a board recognition camera 810 and that is attached to the X-axis ball screw shaft is moved to a position at which placement is to be performed on an electronic circuit board 8. On the other hand, the fourth embodiment of the present invention is characterized by the 15 constitution and operations shown in FIGS. 21–24 and described as above. When FIG. 20 and FIGS. 21–24 are compared, the whole X-Y robot requires a facility width of c+2b in the conventional constitution, while the fourth embodiment of the present invention can be constituted with only a facility width of c since no Y-axis ball screw shaft is provided on both sides.

As described above, according to the fourth embodiment, since the X-Y robot as constitution thereof includes the one Y-axis direction moving apparatus as the ceiling suspended type, and the X-axis direction moving apparatus is suspended therebelow, the equipment frame width can be reduced in comparison with the conventional apparatus.

Furthermore, according to the fourth embodiment, by including a linear motor as the X-axis direction moving apparatus, a space for a motor unit due to a conventional ball screw shaft can be eliminated, and, as a result, the equipment frame width can be reduced in comparison with the conventional apparatus. Furthermore, since the equipment width is reduced and a small size board is used, in the ceiling suspended type X-Y robot using the linear motor as the X-axis direction moving apparatus, bending in the vicinity of the center in the X-axis direction can be reduced, and hence the placement precision can be further improved. That is, by disposing the Y-axis direction moving apparatus almost immediately above a component placement position at which electronic components are placed on a board, bending in the vicinity of the center in the X-axis direction can be reduced, and precision in placement of the electronic components can be improved. Conventionally, since two Y-axis direction moving apparatuses are provided on both sides of the component placing apparatus and one X-axis direction moving apparatus is disposed thereon, the X-axis robot is bent at a position at which a task is actually being performed, and hence placement of micro components is difficult. On the other hand, in the fourth embodiment, micro components can be placed in high precision as described above.

Furthermore, in the fourth embodiment, the board recognition camera 710 as one example of a recognition unit is disposed at a position different from in the conventional apparatus.

Figure 26:
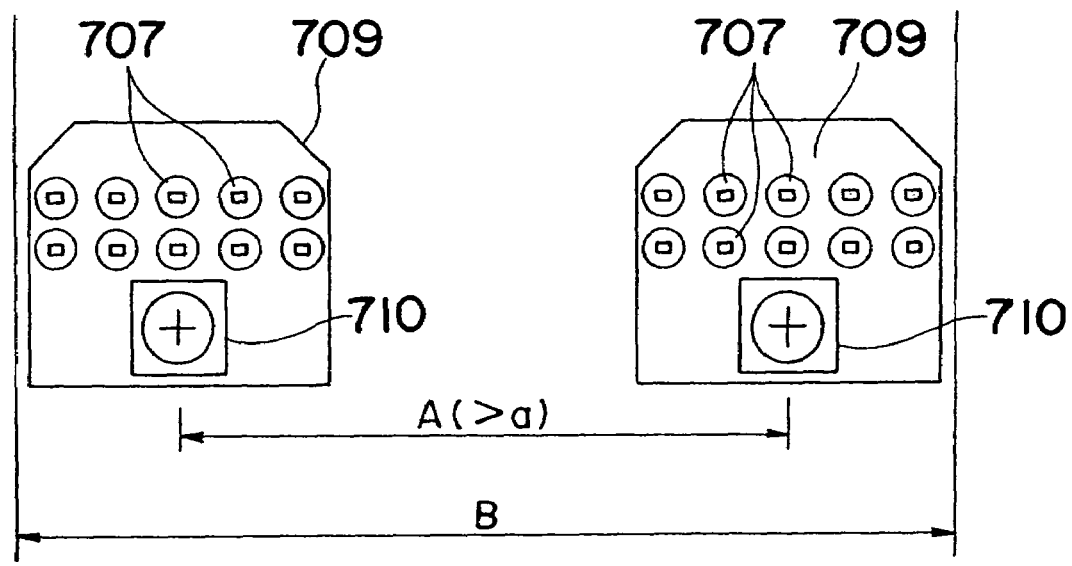
FIG. 26 is a showing the structural view inside of a head unit of the electronic component placing apparatus according to the fourth embodiment of the present invention shown in FIG. 24.

That is, in addition to FIGS. 21–24, FIG. 26 is a structural view showing a head unit 709 in the above electronic component placing apparatus and a schematic view showing two head units 709 included in the equipment viewed from below. Reference numeral 707 denotes a nozzle for sucking and placing an electronic component 99. Reference numeral 710 denotes a board recognition camera for picking up images of board marks (for example, the conventional board marks 808 in FIG. 19) provided on an electronic circuit board 8. As shown in FIG. 26, the head unit is equipped therein with the board recognition camera 710 in front of a plurality of the nozzles 707 arranged in two lines in the X direction.

Operations of the electronic component placing apparatus of the fourth embodiment having the above constitution are explained below with reference to FIGS. 21–24 and FIG. 26.

After an electronic circuit board 8 is carried into the equipment, the head unit 709 is moved, for example, downwards in FIG. 26 to above the board marks provided on the electronic circuit board 8 by the X-Y robot, images of the board marks is picked up by the board recognition camera 710 of the head unit 709, and correction is made for placement to an arbitrary position on the electronic circuit board 8. Furthermore, the head unit 709 is moved upwards in FIG. 26 by the X-Y robot and sucks a component 99 from a component feeding cassette 5 in FIG. 3 so that placement to an arbitrary position on the electronic circuit board 8 can be performed.

Figure 25:
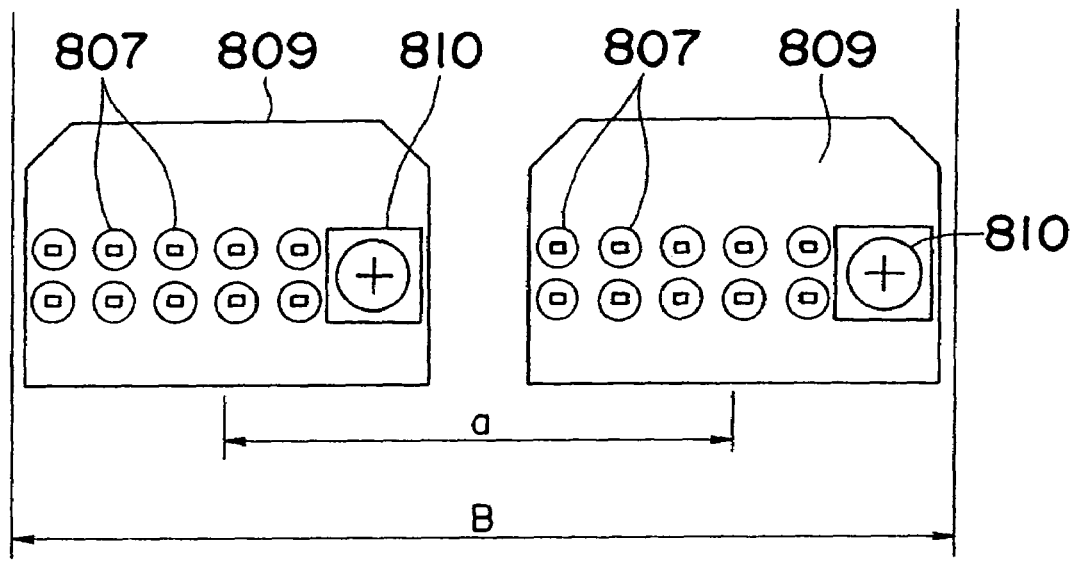
FIG. 25 is a structural view showing the inside of a conventional head unit of an electronic component placing apparatus.

Differences between the electronic component placing apparatus according to the fourth embodiment of the present invention and a conventional electronic component placing apparatus are explained below with reference to FIGS. 25 and 26. FIG. 25 is a structural view showing the inside of a conventional head unit. As shown in FIG. 25, the conventional head unit includes therein a board recognition camera 810 on an extension of a plurality of nozzles 807 arranged in two lines in the X direction, and a stroke a when the electronic components are sucked and placed is small with respect to a width B between both ends of the two head units 809 disposed in the equipment. On the other hand, in the electronic component placing apparatus according to the fourth embodiment of the present invention, since the component recognition camera 710 is disposed in front of a plurality of nozzles 707 arranged in two lines in the X direction as shown in FIG. 26 and described as above, a sucking and placing stroke A can be made large with respect to the same width B between the both ends of the two head units.

As a working example, when the stroke (distance between centers of the head units) a is 240 mm and the width B between the both ends of the two head units is 450 mm, a sucking stroke A can be moved by 150 mm each towards both sides with respect to the center and the total sucking stroke A becomes 300 mm in the fourth embodiment. On the other hand, in the conventional apparatus, the conventional sucking stroke cannot be moved by the width of the camera at the right end of FIG. 25, which is 60 mm, and becomes 300 mm−60 mm=240 mm. Therefore, from (sucking stroke of fourth embodiment/conventional sucking stroke)×100= (300/240)×100=125, the sucking stroke can be increased by 25%.

As described above, according to the fourth embodiment, since the head unit is equipped with a board recognition camera in front of the nozzles as the constitution of the head unit, the sucking and placing stroke in the nozzle arrangement direction, that is, the X direction can be increased in comparison to the conventional apparatus.

As described above, according to the present invention, in the electronic component placing apparatus, first, since the X-Y robot is constituted such that the Y-axis direction moving apparatus is disposed as a ceiling suspended type and that the X-axis direction moving apparatus is suspended therebelow, the equipment frame width can be reduced.

Furthermore, since a linear motor is adopted as the X-axis direction moving apparatus, a space for a motor unit due to adoption of a ball screw shaft in the conventional constitution can be eliminated, and hence the equipment frame width can be reduced.

Furthermore, in the head unit drive apparatus having nozzles and an optical image pickup apparatus as the recognition unit for picking up the images of the board marks provided on electronic circuit board, since the optical image pickup apparatus is disposed between both ends in the X direction of a plurality of nozzles arranged in one line or a plurality of lines in the X-axis direction and in front or rear in the Y-axis direction, the stroke for sucking and placing electronic components can be increased.

Therefore, by the fourth embodiment, area productivity in the electronic component placing apparatus can be improved. That is, area productivity can be improved due to reduction of the equipment frame width and increase of the stroke for sucking and placing electronic components.

By appropriately combining arbitrary embodiments out of the above various embodiments, effects of the respective embodiments can be demonstrated.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for producing a mounted-board, comprising:
   electronic component placing devices for placing electronic components onto boards having a length L, of at most 250 mm, along a board carrying direction, each of said electronic component placing devices including
   (i) an electronic component feeding unit operable to feed some of the electronic components,
   (ii) a carrying unit operable to carry corresponding ones of the boards in the carrying direction from a board retreat position to a component placement position, and from the component placement position to a position outside the component placement position,
   (iii) head units operable to hold a respective some of the components received from said electronic component feeding unit and then to place these held components onto the corresponding ones of the boards, and
   (iv) a drive unit operable to move said head units between said electronic component feeding unit and the corresponding ones of the boards,
   wherein a substantial width of said each of said component placing devices is between 450 mm and 1000 mm inclusively and is equal to 4L+SL along the board carrying direction, with 4L denoting a length equal to the sum of the lengths of the retreat positions associated with the corresponding ones of the boards and the lengths of the component placement positions associated with the corresponding ones of the boards, and with SL denoting a length equal to the sum of the lengths of spaces necessary for positioning a board stop mechanism at each of the board retreat positions and at each of the component placement positions,
   wherein a distance between adjacent ones of said component placing devices is equal to at most L.

2. The apparatus according to claim 1, wherein
   said electronic component feeding unit is operable to feed the some of the electronic components to said head units, and
   said component feeding unit is positioned only on one side of the carrying path.

3. The apparatus according to claim 2, wherein
   each of said electronic component placing devices further includes a cover for housing said head unit and said drive unit, with the distance between said adjacent ones of said electronic component placing devices being defined by said cover.

4. The apparatus according to claim 1, wherein
   each of said electronic component placing devices further includes a cover for housing said head unit and said drive unit, with the distance between said adjacent ones of said electronic component placing devices being defined by said cover.

* * * * *